(12) United States Patent
Osada et al.

(10) Patent No.: US 10,269,403 B2
(45) Date of Patent: Apr. 23, 2019

(54) SEMICONDUCTOR STORAGE DEVICE

(71) Applicant: TOSHIBA MEMORY CORPORATION, Minato-ku, Tokyo (JP)

(72) Inventors: Yoshiaki Osada, Kawasaki Kanagawa (JP); Kosuke Hatsuda, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,587

(22) Filed: Sep. 1, 2017

(65) Prior Publication Data

US 2018/0012640 A1    Jan. 11, 2018

Related U.S. Application Data

(63) Continuation of application No. PCT/JP2015/076372, filed on Sep. 10, 2015.
(Continued)

(51) Int. Cl.
*G11C 11/16* (2006.01)
*H01L 27/22* (2006.01)
(Continued)

(52) U.S. Cl.
CPC .......... *G11C 11/1673* (2013.01); *G11C 7/04* (2013.01); *G11C 7/065* (2013.01);
(Continued)

(58) Field of Classification Search
CPC .............. G11C 11/1673; G11C 11/161; G11C 11/1657; G11C 11/1655; G11C 11/1697; H01L 27/228; H01L 43/08
See application file for complete search history.

(56) References Cited

U.S. PATENT DOCUMENTS 8,154,903 B2 *   4/2012   Jung .................... G11C 11/1673
                                                            365/148
9,281,039 B2 *   3/2016   Jung ..................... G11C 11/161
                   (Continued)

FOREIGN PATENT DOCUMENTS

JP       2004178623 A      6/2004
JP       2007172703 A      7/2007
                   (Continued)

OTHER PUBLICATIONS

International Search Report (ISR) and Written Opinion dated Oct. 27, 2015 issued in International Application No. PCT/JP2015/076372.

*Primary Examiner* — Tri M Hoang
(74) *Attorney, Agent, or Firm* — Holtz, Holtz & Volek PC

(57) ABSTRACT

According to one embodiment, a semiconductor storage device includes a memory cell, a bit line connected to the memory cell, and a sense circuit connected to the bit line, wherein the sense circuit includes a first transistor with a first end connected to the bit line, a second transistor with a first end connected to a second end of the first transistor, a third transistor with a first end connected to the bit line, a fourth transistor with a first end connected to a second end of the third transistor, and an amplifier connected to a second end of the second transistor and to a second end of the fourth transistor.

19 Claims, 20 Drawing Sheets

Related U.S. Application Data

(60) Provisional application No. 62/130,484, filed on Mar. 9, 2015.

(51) Int. Cl.
  *H01L 43/08* (2006.01)
  *G11C 7/04* (2006.01)
  *G11C 7/06* (2006.01)
  *G11C 13/00* (2006.01)
  *G11C 7/12* (2006.01)

(52) U.S. Cl.
  CPC ...... *G11C 11/1653* (2013.01); *G11C 11/1655* (2013.01); *G11C 13/004* (2013.01); *G11C 13/0023* (2013.01); *G11C 13/0026* (2013.01); *G11C 7/12* (2013.01); *G11C 11/161* (2013.01); *G11C 11/1657* (2013.01); *G11C 11/1697* (2013.01); *G11C 2013/0042* (2013.01); *G11C 2013/0054* (2013.01); *H01L 27/228* (2013.01); *H01L 43/08* (2013.01)

(56) References Cited

U.S. PATENT DOCUMENTS

| | | |
|---|---|---|
| 2004/0114443 A1 | 6/2004 | Ezaki et al. |
| 2007/0280021 A1 | 12/2007 | Ueda et al. |
| 2010/0321976 A1 | 12/2010 | Jung et al. |
| 2013/0155755 A1 | 6/2013 | Park et al. |
| 2014/0153325 A1* | 6/2014 | Wang ............... G11C 13/0004 365/158 |

FOREIGN PATENT DOCUMENTS

| | | |
|---|---|---|
| JP | 2007323706 A | 12/2007 |
| JP | 2014220026 A | 11/2014 |
| WO | 2007077625 A1 | 7/2007 |
| WO | 2015132980 A1 | 9/2015 |

\* cited by examiner

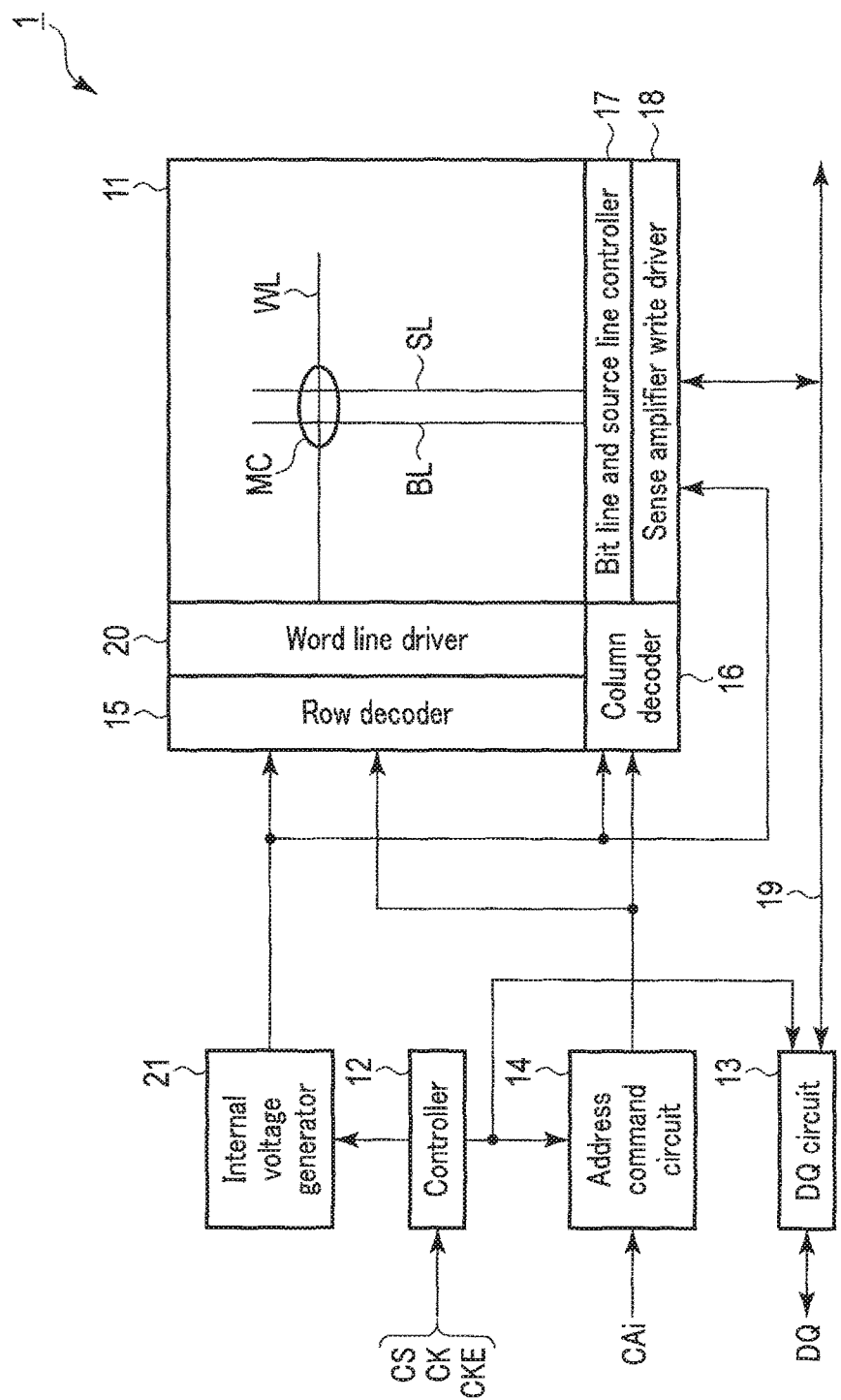
F I G. 1

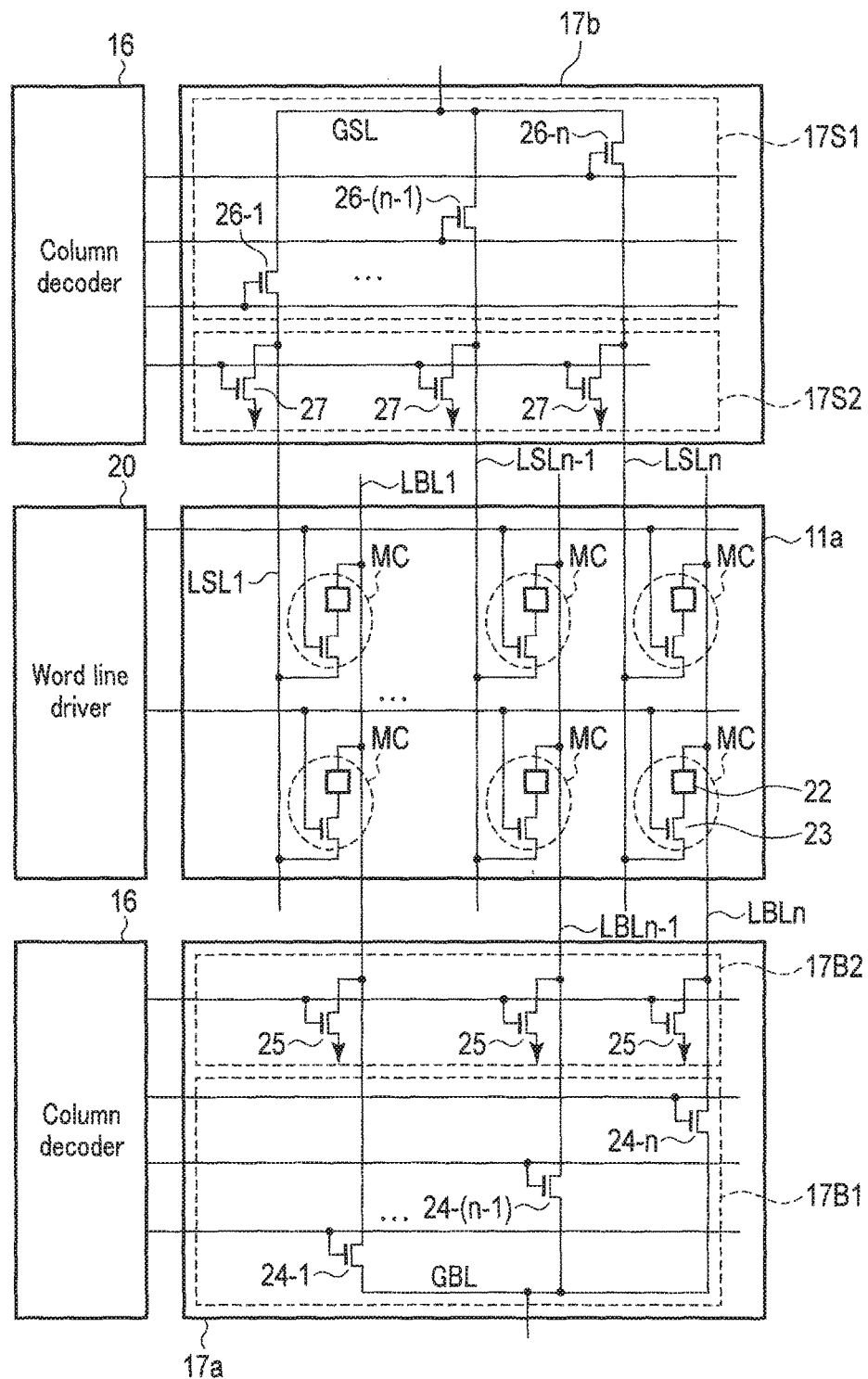
F I G. 5

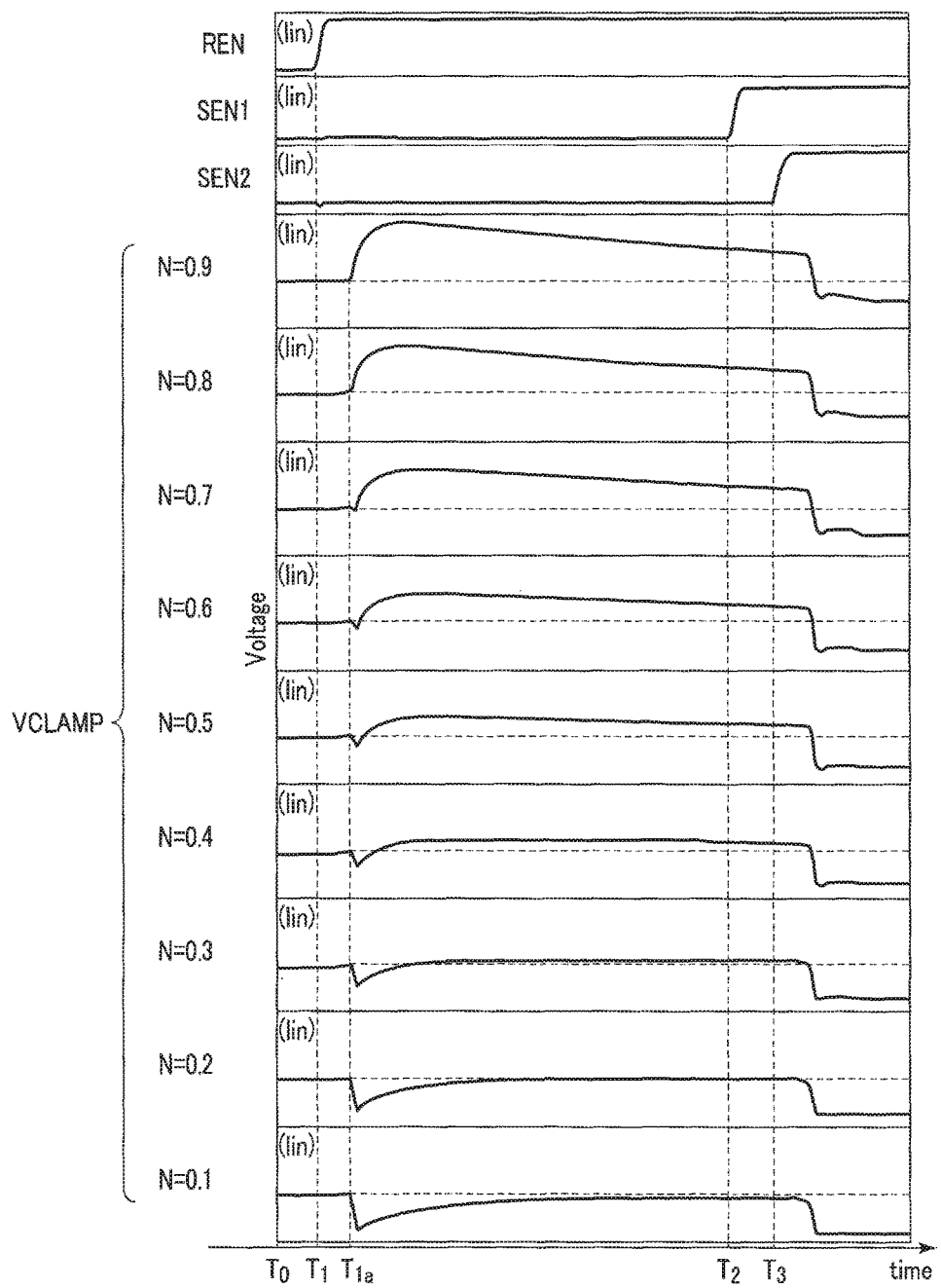
F I G. 13

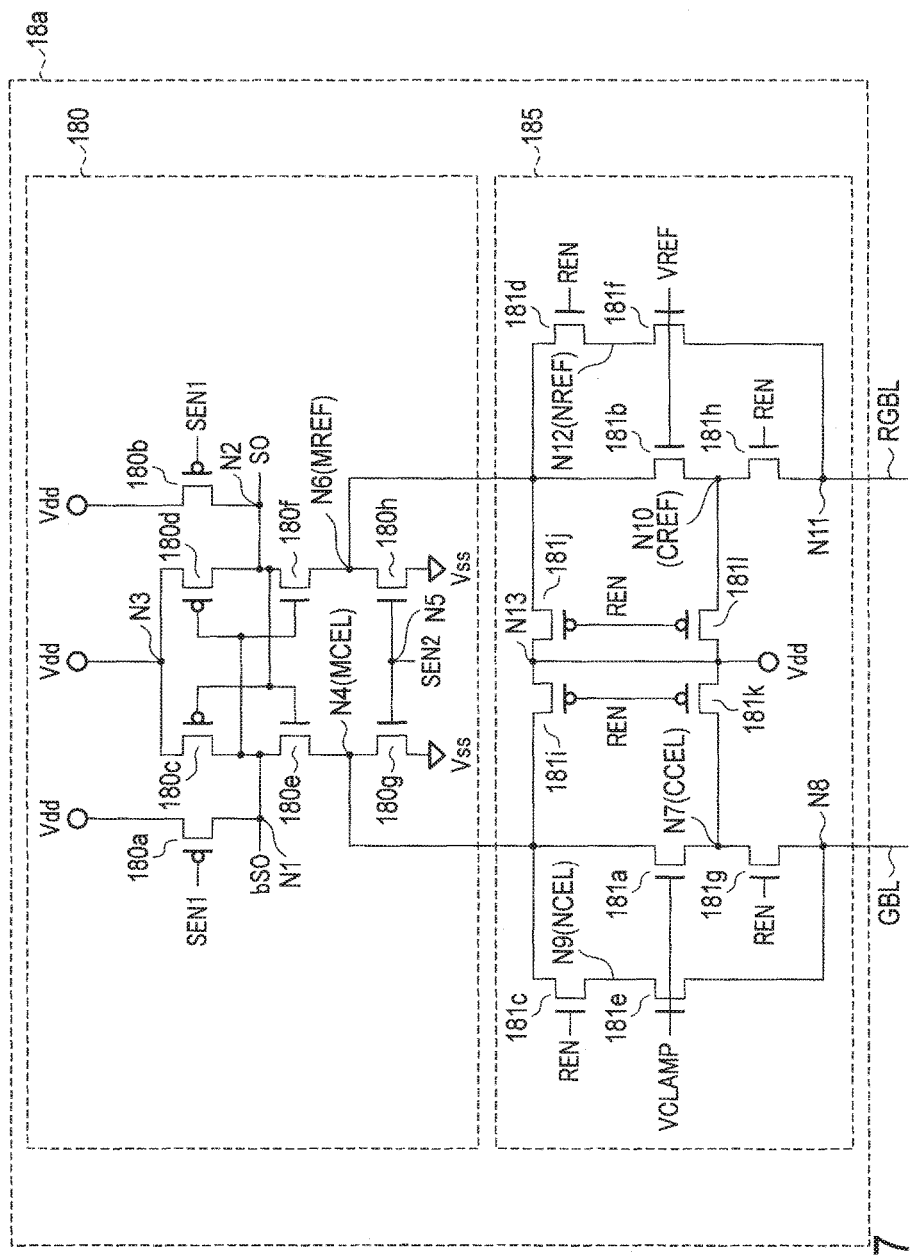
F I G. 17

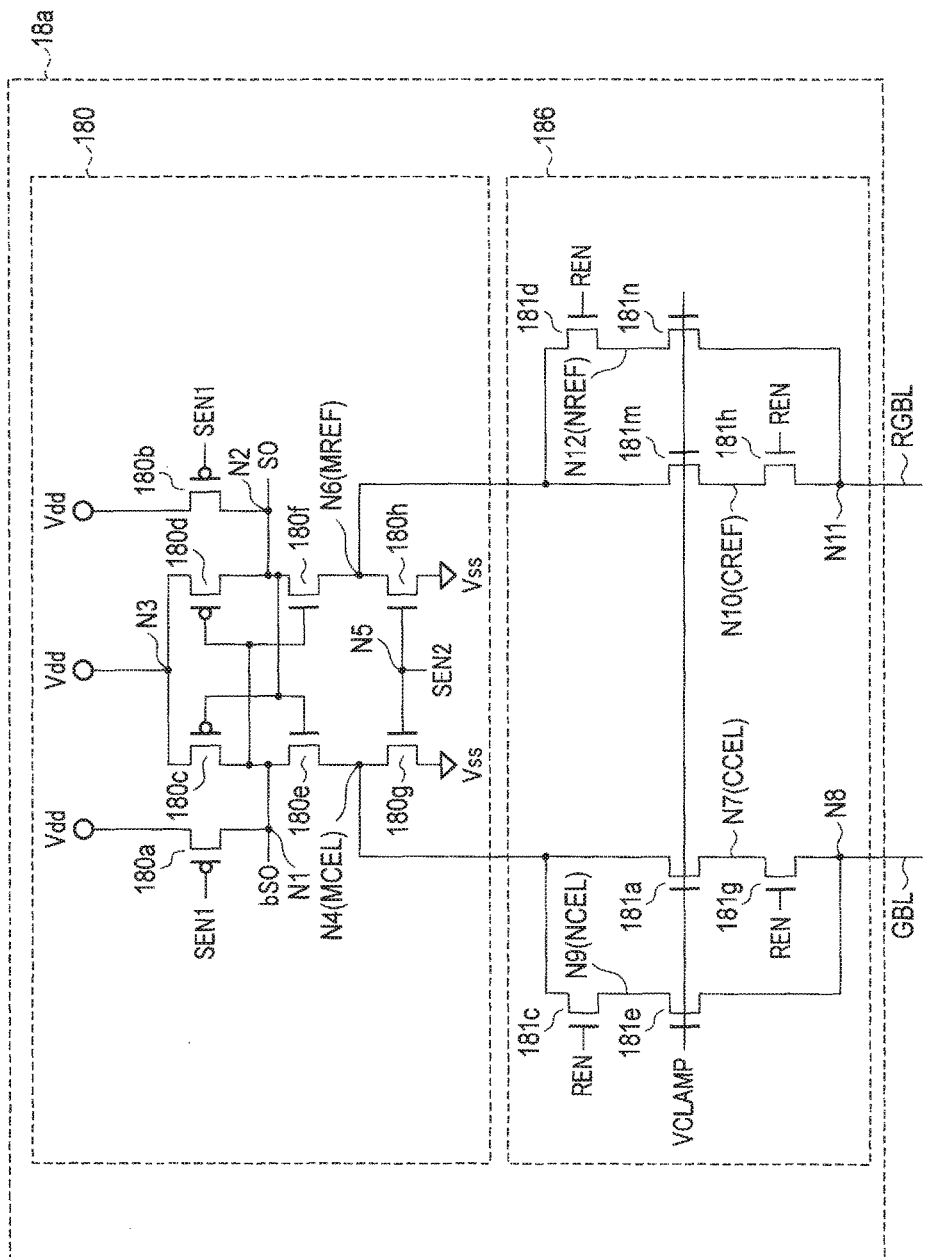
F I G. 19

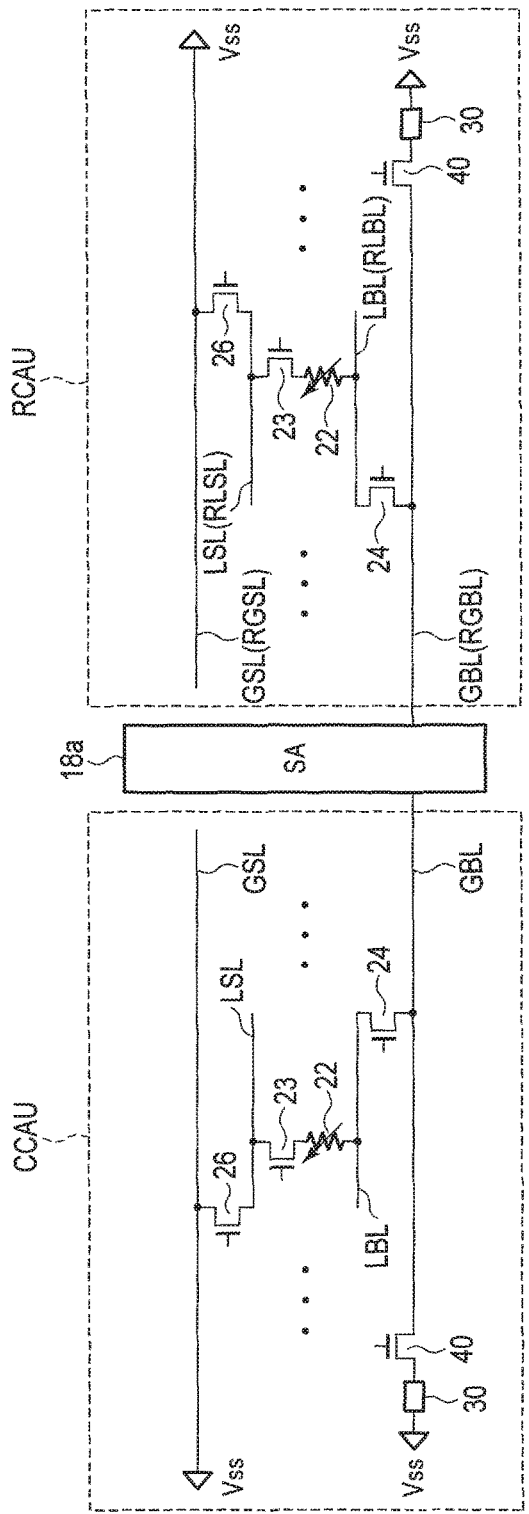
F I G. 22

SEMICONDUCTOR STORAGE DEVICE

CROSS-REFERENCE TO RELATED APPLICATIONS

This application is a Continuation Application of PCT Application No. PCT/JP2015/076372, filed Sep. 10, 2015 and based upon and claiming the benefit of priority from prior U.S. Provisional Application No. 62/130,484, filed Mar. 9, 2015, the entire contents of all of which are incorporated herein by reference.

FIELD

Embodiments of the present invention relate to a semiconductor storage device.

BACKGROUND

MRAM (Magnetoresistive Random Access Memory) is memory device that uses magnetic elements with a magnetoresistive effect as memory cells that store information, and have been attracting attention as next-generation memory device characterized by high-speed operation, large capacity, and non-volatility. Furthermore, research and development have been conducted to enable MRAM to replace volatile memory such as DRAM and SRAM. In this case, MRAM is desirably operated in accordance with the same specifications as those of DRAM and SRAM in order to keep development costs low and to allow the replacement to be smoothly achieved.

BRIEF DESCRIPTION OF THE DRAWINGS

FIG. 1 is a block diagram depicting a configuration of a semiconductor storage device according to a first embodiment;

FIG. 5 is a circuit diagram illustrating a relation between the cell array and the bit line and source line controller in the semiconductor storage device according to the first embodiment;

FIG. 13 is a waveform diagram illustrating a read operation in the semiconductor storage device according to the first embodiment;

FIG. 17 is a circuit diagram depicting a basic configuration of a sense amplifier in a semiconductor storage device according to a third embodiment;

FIG. 19 is a circuit diagram depicting a basic configuration of a sense amplifier in a semiconductor storage device according to a fourth embodiment;

FIG. 22 is a diagram illustrating a relation between a sense amplifier and a peripheral circuit for the sense amplifier in a semiconductor storage device according to a fifth embodiment.

DETAILED DESCRIPTION

Figure 2:
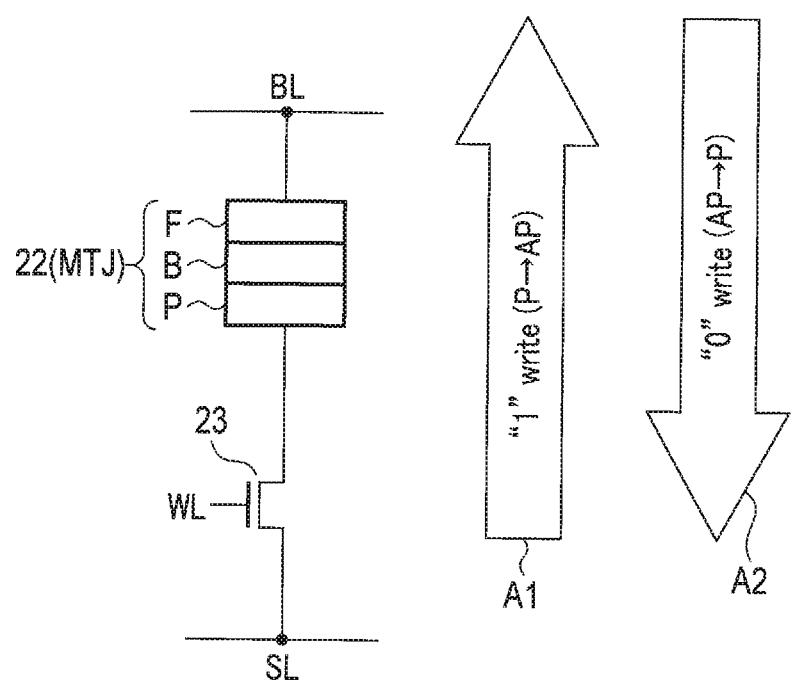
FIG. 2 is a diagram illustrating a write operation performed on a memory cell in the semiconductor storage device according to the first embodiment.

In general, according to one embodiment, a semiconductor storage device includes a memory cell, a bit line connected to the memory cell, and a sense circuit connected to the bit line, wherein the sense circuit includes a first transistor with a first end connected to the bit line and a gate to which a first signal is input, second transistor with a first end connected to a second end of the first transistor and a gate to which a second signal is input, a third transistor with a first end connected to the bit line and a gate to which the second signal is input, a fourth transistor with a first end connected to a second end of the third transistor and a gate to which the first signal is input, and an amplifier connected to a second end of the second transistor and to a second end of the fourth transistor.

Embodiments will be described below with reference to the drawings. Components with substantially identical functions and configurations are denoted by identical reference numerals, and duplicate descriptions are given only when needed. Furthermore, the embodiments disclosed below illustrate apparatuses and methods for embodying technical concepts of the embodiments, and the technical concepts of the embodiments are not intended to limit materials, shapes, arrangements, and the like of components to those described below. Various changes may be made to the technical concepts of the embodiments within the scope of the claims.

(First Embodiment)

<1-1> Configuration of the Semiconductor Storage Device According to the First Embodiment First, a basic configuration of a semiconductor storage device according to a first embodiment will be described in brief using FIG. 1.

A semiconductor storage device 1 according to the first embodiment includes a memory cell array (hereinafter also simply referred to as a cell array) 11, a controller 12, a DQ circuit 13, an address command circuit 14, a row decoder 15, a column decoder 16, a bit line and source line controller 17, a sense amplifier write driver 18, a word line driver 20, and an internal voltage generator 21. For each memory cell array 11, the column decoder 16 generates control signals for the word line driver 20 and control signals for the bit line and source line controller 17.

The memory cell array 11 is an MRAM and includes a plurality of memory cells MC two-dimensionally arranged in a matrix. Each of the memory cells MC includes an MTJ element 22 (not depicted in the drawings) and a cell transistor 23 (not depicted in the drawings). The MTJ element 22 is a magnetic tunnel junction element which stores data in accordance with a change in resistance state and which enables data to be rewritten in accordance with a current. The cell transistor 23 is provided in association with the MTJ element 22 and configured to be set to an electrically continuous state when passing a current to the corresponding MTJ element 22.

A plurality of word lines WL are routed in a row direction and a plurality of bit lines BL are routed in a column direction such that the word lines WL intersect the bit lines BL. Two adjacent bit lines BL form a pair, and the memory cell MC is provided in association with an intersection point between the word line WL and the bit line pair (in the present embodiment, referred to as the bit line BL, a source line SL for convenience). The MTJ element 22 and cell transistor 23 in each memory cell MC are connected between the bit line pair (for example, between the BL and the SL) in series with the bit line pair. Furthermore, a gate of the cell transistor 23 is connected to the word line WL.

Various external control signals, for example, a chip select signal CS, a clock signal CK, and a clock enable signal CKE are input to the controller 12. The controller 12 controls the address command circuit 14 to distinguish addresses from commands.

A command address signal CAi is input to the address command circuit 14. The address command circuit 14 transfers the command address signal CAi to the row decoder 15 and the column decoder 16.

The row decoder 15 is arranged on opposite sides of the memory cell array 11 in a word line direction to decode an address in the command address signal CAi supplied by the address command circuit 14.

The column decoder 16 recognizes a command and an address in the command address signal CAi based on an external control signal to control the bit line and source line controller 17.

The bit line and source line controller 17 is arranged on opposite sides of the memory cell array 11 in a bit line direction to control the bit lines BL and the source lines SL based on control signals from the column decoder 16.

The sense amplifier write driver 18 is arranged in the bit line direction of the memory cell array 11. The sense amplifier is connected to the bit lines BL to detect a current flowing through the memory cell MC connected to the selected word line WL to read data stored in the memory cell. The write driver is connected to the bit lines BL to pass a current through the memory cell MC connected to the selected word line WL to write data to the memory cell MC.

Furthermore, the sense amplifier write driver 18 includes a page buffer not depicted in the drawings. The pace buffer holds data read by the sense amplifier or data received via a data bus 19 and the DQ circuit 13.

Transmission and reception of data between the sense amplifier write driver 18 and an external I/O terminal DQ are performed via the data bus 19 and the DQ circuit 13.

The word line driver 20 is arranged on opposite sides of the memory cell array 11 in the word line direction. The word line driver 20 is connected to the word lines and configured to apply a voltage to the selected word line WL at the time of data reading or data writing. More specifically, the word line driver 20 is configured to be able to apply a voltage to the selected word line WL in accordance with a row address decoded by the row decoder 15.

The internal voltage generator 21 is provided to generate an internal voltage (for example, a voltage to which a power supply voltage is increased) needed for each operation in the semiconductor storage device 1. The internal voltage generator 21 is also controlled by the controller 12 to perform a boosting operation to generate a needed voltage.

<1-2> Configuration of the Memory Cell MC

Subsequently, a configuration of the memory cell MC according to the first embodiment will be described in brief using FIG. 2.

As depicted in FIG. 2, a first end of the MTJ element 22 in the memory cell MC according to the first embodiment is connected to the bit line BL, and a second end of the MTJ element 22 is connected to a first end of the cell transistor 23. A second end of the cell transistor 23 is connected to the source line SL. The MTJ element 22 utilizing a TMR (tunneling magnetoresistive) effect includes a stack structure including two ferromagnetic layers F, P and a nonmagnetic layer (tunnel insulating film) B sandwiched between the ferromagnetic layers F, P. The MTJ element 22 stores digital data in accordance with a change in magnetic resistance as with a spin polarized tunneling effect. The MTJ element 22 may be in a low resistance state or a high resistance state depending on magnetization arrangements in the two ferromagnetic layers F, P. For example, when the low resistance state is defined to be data "0" and the high resistance state is defined to be data "1", 1 bit data can be recorded in the MTJ element 22. Naturally, the low resistance state may be defined to be the data "1" and the high resistance state may be defined to be the data "0".

For example, the MTJ element 22 is configured by sequentially stacking a fixed layer (pinned layer) P, a tunnel barrier layer B, a recording layer (free layer) F. The pinned layer P and the free layer F are formed of a ferromagnetic substance, and the tunnel barrier layer B is formed of an insulating film (for example, $Al_2O_3$, MgO). The pinned layer P is a layer in which the direction of the magnetization arrangement is fixed, and the direction of the magnetization arrangement is variable in the free layer F. Data is recorded in accordance with the direction of magnetization.

When a current is passed in the direction of arrow A1 at the time of writing, the direction of the magnetization in the free layer F becomes anti-parallel to the direction of the magnetization in the pinned layer P (AP state), and the MTJ element 22 is set to the high resistance state (data "1"). When a current is passed in the direction of arrow A2 at the time of writing, the directions of the magnetizations in the pinned layer P and the free layer F become parallel to each other (P state), and the MTJ element 22 is set to the low resistance state (data "0"). In this manner, different data can be written to the MTJ element depending on the direction in which the current is passed.

<1-3> Configuration of the Memory Cell Array

Now, a configuration of the memory cell array according to the first embodiment will be described in brief using FIGS. 3 to 5.

Figure 3:
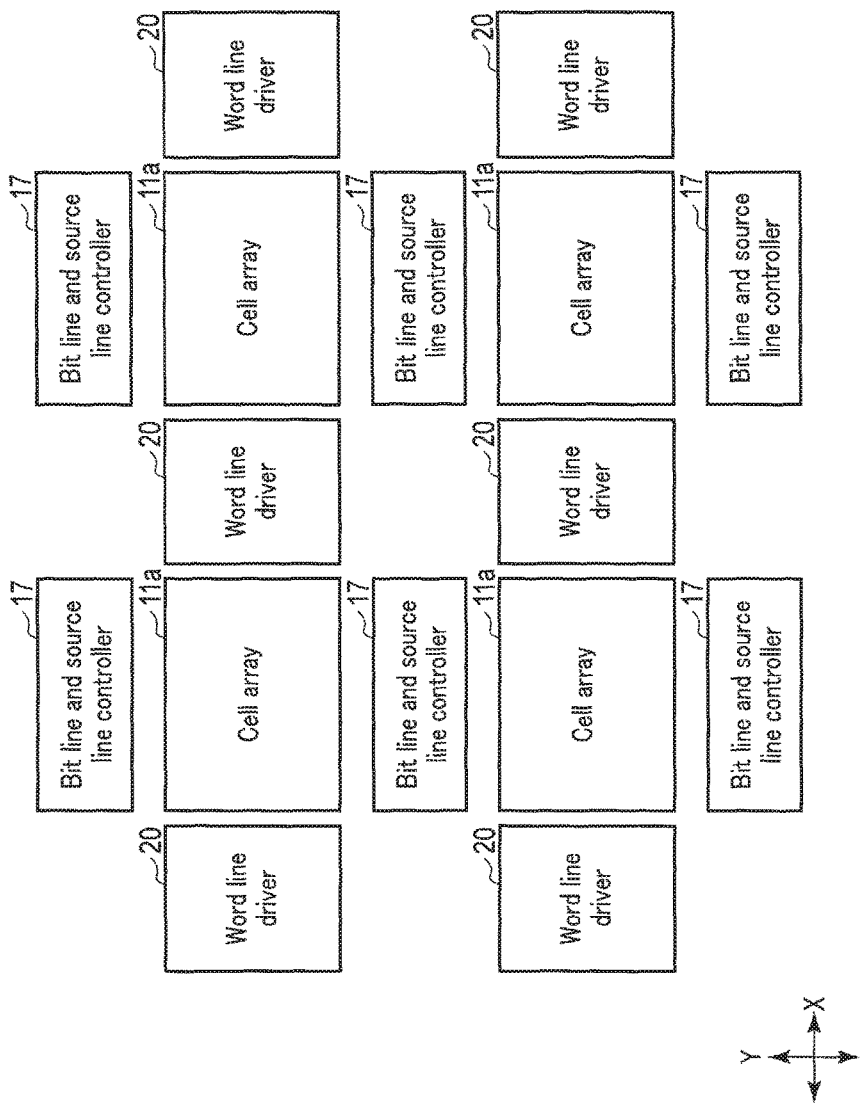
FIG. 3 depicts an example of a layout of cell arrays and peripheral circuits for the cell arrays in the semiconductor storage device according to the first embodiment.

As depicted in FIG. 3, the memory cell array 11 includes a plurality of cell arrays 11a. The bit line and source line controllers 17 are provided along opposite ends of each cell array 11a along an X direction. The two bit line and source line controllers 17 arranged along each cell array 11a are used to control the cell array 11a.

Furthermore, as depicted in FIG. 3, the word line driver 20 is provided along opposite ends of each cell array 11a along a Y direction. The two word line drivers 20 arranged along each cell array 11a are used to control the cell array 11a.

Figure 4:
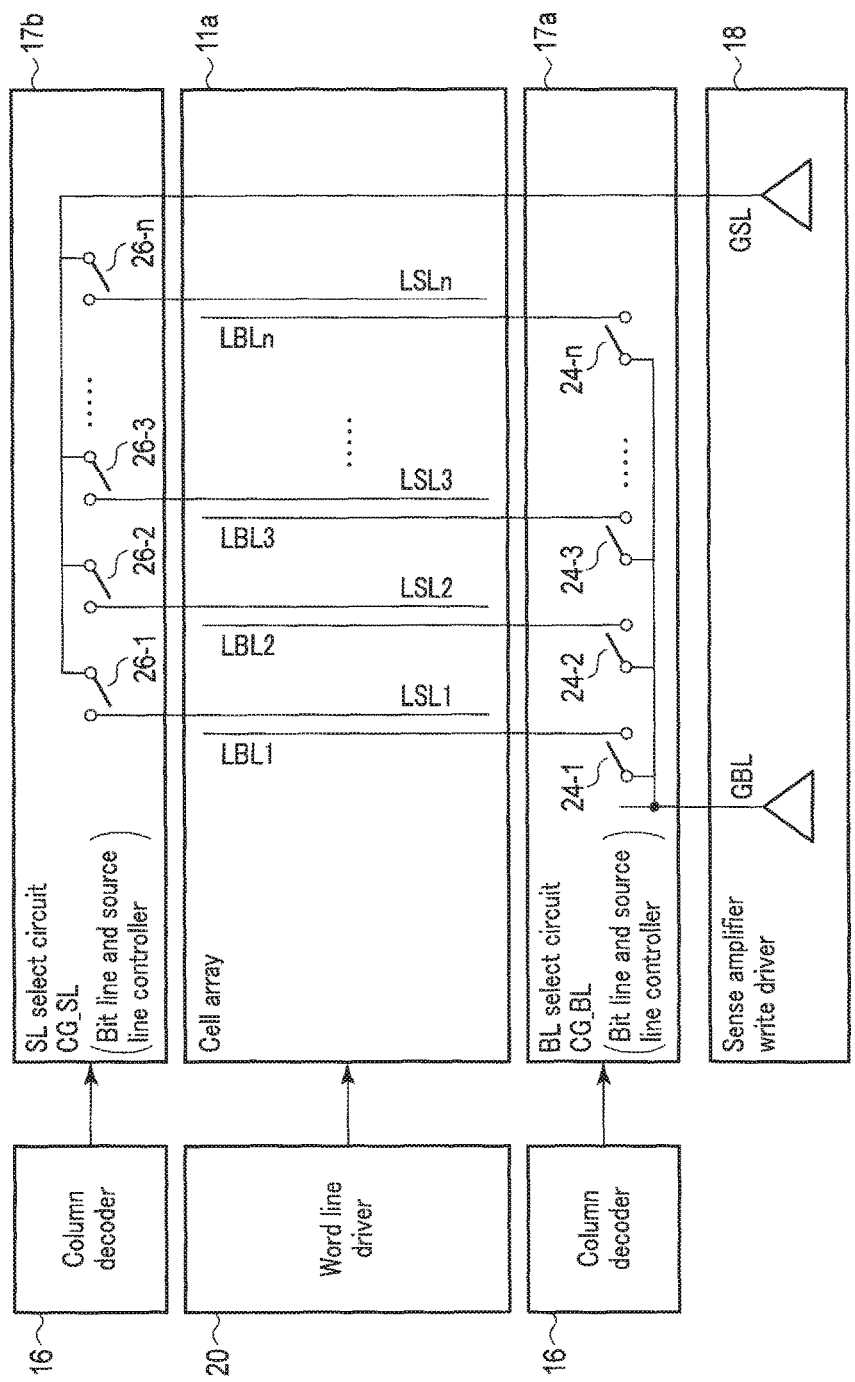
FIG. 4 is a block diagram illustrating a relation between the cell array and a bit line and source line controller in the semiconductor storage device according to the first embodiment.

Subsequently, as depicted in FIG. 4, the bit line and source line controller 17 includes a bit line select circuit (CG_BL) 17a and a source line select circuit (CG_SL) 17b.

The bit line select circuit 17a includes switch transistors 24-1 to 24-n (n is an integer of at least 1) to selectively connect a global bit line GBL from the sense amplifier write driver 18 to n local bit lines LBL1 to LBLn.

Furthermore, the source line select circuit 17b includes switch transistors 26-1 to 26-n to selectively connect a global source line GSL from the sense amplifier write driver 18 to n local source lines LSL1 to LSLn.

An output from the word line driver 20 is connected to the cell array 11a to activate the word line corresponding to a selected sell.

The bit line select circuit 17a receives an output signal from the column decoder 16. In the bit line select circuit 17a, based on the output signal, a switch transistor 24-i of the n switch transistors 24-1 to 24-n which is related to a selected local bit line LBLi (i is an integer of at least 1) is turned on. Then, the selected local bit line LBLi is connected to the global bit line GBL and thus to the sense amplifier write driver 18.

Similarly, the source line select circuit 17b receives an output signal from the column decoder 16. In the source line select circuit 17b, based on the output signal, a switch transistor 26-i of the n switch transistors 26-1 to 26-n which is related to a selected local source line LSLi is turned on. Then, the selected local source line LSLi is connected to the global source line GSL and thus to the sense amplifier write driver 18.

As depicted in FIG. 5, the bit line select circuit 17a includes a column select circuit 17B1 and a bit line discharge circuit 17B2.

The column select circuit 17B1 includes cell transistors 24-1 to 24-n functioning as switch transistors 24-1 to 24-n. An output signal from the column decoder 16 is input to a gate electrode of each of the cell transistors 24-1 to 24-n, and the global bit line GBL is connected to a first end of each of the cell transistor 24-1 to 24-n. Furthermore, to a second end of each of the cell transistors 24-1 to 24-n, the corresponding one of the local bit lines LBL1 to LBLn is connected.

The bit line discharge circuit 17B2 includes reset transistors 25 each located between a corresponding one of the cell transistor 24-1 to 24-n and a corresponding one of the local bit lines LBL1 to LBLn. The bit line discharge circuit 17B2 connects the local bit line LBL to a ground potential (VSS) based on a reset signal from the column decoder 16. More specifically, an output signal from the column decoder 16 is input to a gate of the reset transistor 25. Furthermore, one of the local bit lines LBL1 to LBLn is connected to a first end of the reset transistor 25, and a second end of the reset transistor 25 is connected to the ground potential.

Furthermore, as depicted in FIG. 5, the source line select circuit 17b includes a column select circuit 17S1 and a source line discharge circuit 17S2.

The column select circuit 17S1 includes cell transistors 26-1 to 26-n functioning as switch transistors 26-1 to 26-n. An output signal from the column decoder 16 is input to a gate electrode of each of the cell transistors 26-1 to 26-n, and the global source line GSL is connected to a first end of each of the cell transistor 26-1 to 26-n. Furthermore, to a second end of each of the cell transistors 26-1 to 26-n, the corresponding one of the local source lines LSL1 to LSLn is connected.

The source line discharge circuit 17S2 includes reset transistors 27 each located between a corresponding one of the cell transistor 26-1 to 26-n and a corresponding one of the local source lines LSL1 to LSLn. The source line discharge circuit 17S2 connects the local source line LSL to the ground potential based on the reset signal from the column decoder 16. More specifically, an output signal from the column decoder 16 is input to a gate of the reset transistor 27. Furthermore, one of the local source lines LSL1 to LSLn is connected to a first end of the reset transistor 27, and a second end of the reset transistor 27 is connected to the around potential.

<1-4> Configuration of the Sense Amplifier

The sense amplifier according to the present embodiment will be described using FIG. 6 and FIG. 7. Only a sense amplifier 18a of the sense amplifier write driver 18 will be described below.

Figure 6:
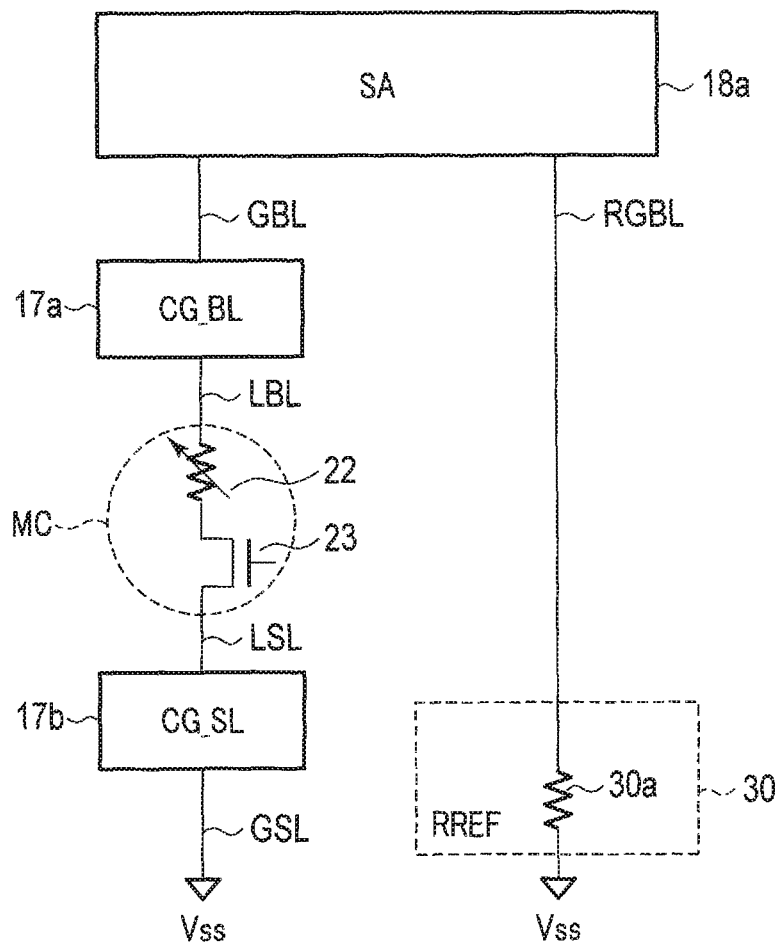
FIG. 6 is a diagram illustrating a relation between a sense amplifier and a peripheral circuit for the sense amplifier in the semiconductor storage device according to the first embodiment.

As depicted in FIG. 6, the sense amplifier 18a is connected to the memory cell MC via the global bit line GBL. Furthermore, the sense amplifier 18a is connected to a reference circuit (RREF) 30 via a reference global bit line RGBL. The reference circuit 30 includes, for example, a resistance element 30a.

Figure 7:
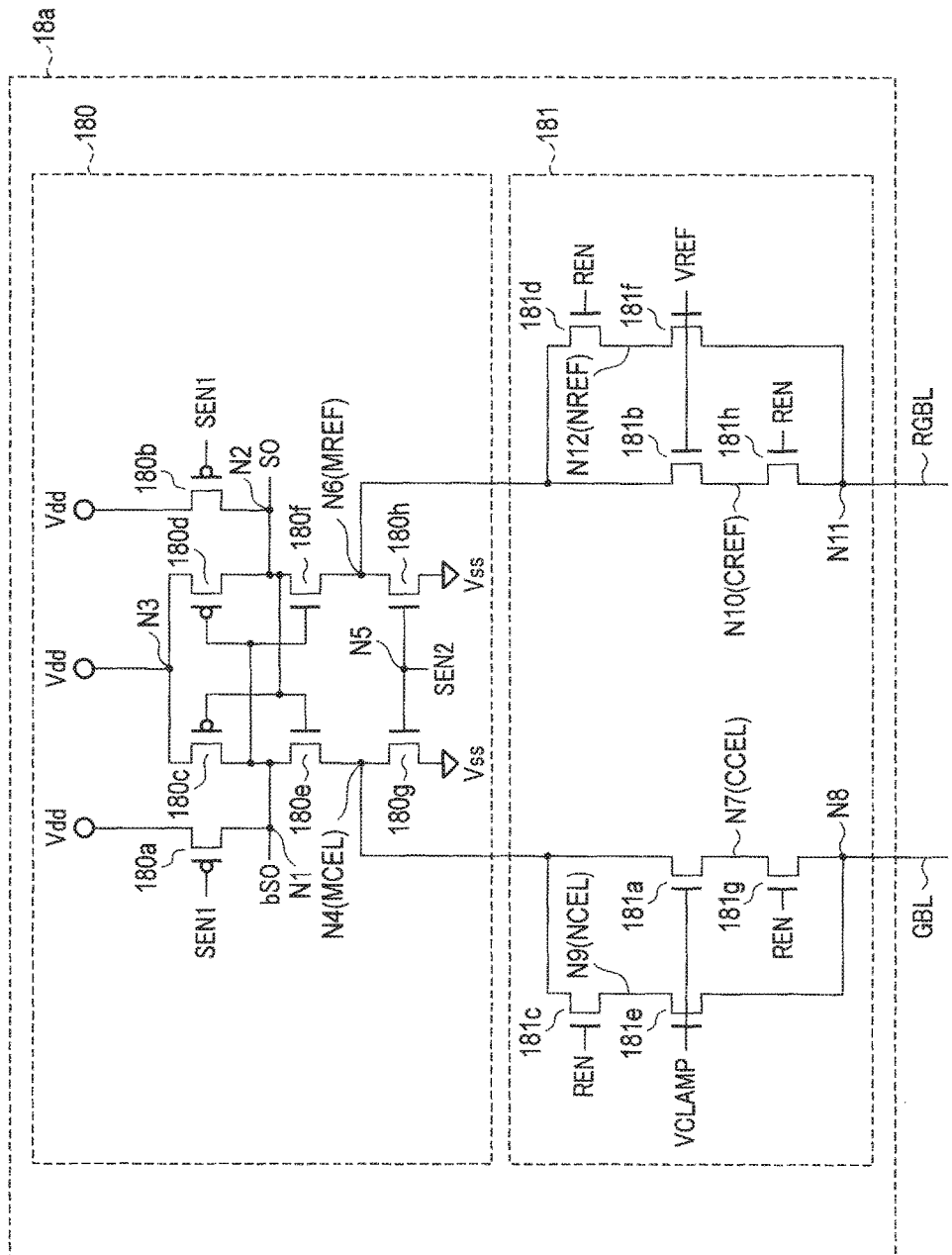
FIG. 7 is a circuit diagram depicting a basic configuration of the sense amplifier in the semiconductor storage device according to the first embodiment.

As depicted in FIG. 7, the sense amplifier 18a includes a converter 181 that converts resistance values for the memory cell MC and the reference circuit 30 into current values, and an amplifier 180 that compares and amplifies two output signals output from the converter 181.

The amplifier 180 includes PMOS transistors 180a, 180b, 180c, and 180d and NMOS transistors 180e, 180f, 180g, and 180h. Furthermore, the converter 181 includes NMOS transistors 181a, 181b, 181c, 181d, 181e, 181f, 181g, and 181h.

<1-4-1> Specific Circuit Configuration of the Amplifier

Subsequently, the amplifier 180 will be described. A power supply (Vdd) is applied to a source of the PMOS transistor 180a. A drain of the PMOS transistor 180a is connected to a node N1. A signal "SEN1" is input to a gate of the PMOS transistor 180a. The power supply (Vdd) is applied to a source of the PMOS transistor 180b. A drain of the PMOS transistor 180a is connected to a node N2. The signal "SEN1" is input to a gate of the PMOS transistor 180b. A source of the PMOS transistor 180c is connected to a node N3 to which the power supply (Vdd) is applied. A drain of the PMOS transistor 180c is connected to the node N1. A gate of the PMOS transistor 180c is connected to the node N2. A source of the PMOS transistor 180d is connected to the node N3 to which the power supply (Vdd) is applied. A drain of the PMOS transistor 180d is connected to the node N2. A gate of the PMOS transistor 180d is connected to the node N1. A drain of the NMOS transistor 180e is connected to the node N1. A source of the NMOS transistor 180e is connected to a node 4 (MCEL). A gate of the NMOS transistor 180e is connected to the node N2. A drain of the NMOS transistor 180f is connected to the node N2. A source of the NMOS transistor 180f is connected to a node 6 (MREF). A gate of the NMOS transistor 180f is connected to the node N1. A drain of the NMOS transistor 180g is connected to the node N4. A source of the NMOS transistor 180g is connected to the ground potential (Vs). A gate of the NMOS transistor 180a is connected to a node 5 to which a signal "SEN2" is input. A drain of the NMOS transistor 180h is connected to the node N6. A source of the NMOS transistor 180h is connected to the ground potential (Vss). A gate of the NMOS transistor 180h is connected to the node 5.

<1-4-2> Specific Circuit Configuration of the Converter

Subsequently, the converter 181 will be described. A drain of the NMOS transistor 181a (clamp transistor) is connected to the node N4. A source of the NMOS transistor 181a is connected to a node N7 (CCEL). A clamp signal "VCLAMP" is input to a gate of the NMOS transistor 181a. A drain of the NMOS transistor 181g (read enable transistor) is connected to the node N7. A source of the NMOS transistor 181g is connected to the global bit line GBL via a node N8. A signal "REN" is input to a gate of the NMOS transistor 181g.

A drain of the NMOS transistor 181c (read enable transistor) is connected to the node N4. A source of the NMOS transistor 181c is connected to a node N9 (NCEL). The signal "REN" is input to a gate of the NMOS transistor 181c. A drain of the NMOS transistor 181e (clamp transistor) is connected to the node N9. A source of the NMOS transistor 181e is connected to the global bit line GBL via the node N8. A signal "VCLAMP" is input to a gate of the NMOS transistor 181e.

A drain of the NMOS transistor 181b (clamp transistor) is connected to the node N6. A source of the NMOS transistor 181b is connected to a node N10 (CREF). A signal "VREF" is input to a gate of the NMOS transistor 181b. A drain of the NMOS transistor 181h (read enable transistor) is connected to a node N10. A source of the NMOS transistor 181h is connected to the reference global bit line RGBL via a node N11. The signal "REN" is input to a gate of the NMOS transistor 181h.

A drain of the NMOS transistor 181d (clamp transistor) is connected to the node N6. A source of the NMOS transistor 181d is connected to a node N12 (NREF). The signal "REN" is input to a gate of the NMOS transistor 181d. A drain of the NMOS transistor 181f (read enable transistor) is connected to a node N12. A source of the NMOS transistor 181f is connected to the reference global bit line RGBL via the node N11. The signal "VREF" is input to a gate of the NMOS transistor 181f.

As described above, in the converter 181, two current paths are formed in parallel between the global bit line GBL and the amplifier 180 during a read operation. Furthermore, in the converter 181, two current paths are formed in parallel between the reference global bit line RGBL and the amplifier 180 during a read operation.

The two current paths between the global bit line GBL and the amplifier 180 are configured such that the positions of the clamp transistor and the read enable transistor in one current path are opposite to the positions of the clamp transistor and the read enable transistor in the other current path. Similarly, the two current paths between the reference global bit line RGBL and the amplifier 180 are configured such that the positions of the clamp transistor and the read enable transistor in one current path are opposite to the positions of the clamp transistor and the read enable transistor in the other current path. The reason will be described below as to why the clamp transistors and the read enable transistors are arranged between the global bit line GBL and the amplifier 180 and between the reference global bit line RGBL so as to form two current paths.

<1-4-2-1> Size of the Transistor

Now, the sizes of the clamp transistors and the read enable transistors provided in the converter 181 according to the present embodiment will be described. In the present embodiment, the dimensional relation between the NMOS transistors 181a and 181e is $(1-N):N (0 \leq N \leq 1)$. Furthermore, the dimensional relation between the NMOS transistors 181g and 181c is $(1-N):N$. Moreover, the dimensional relation between the NMOS transistors 181b and 181f is $(1-N):N$. Moreover, the dimensional relation between the NMOS transistors 181h and 181d is $(1-N):N$.

Now, a configuration of the transistor will be described in brief. The transistor includes an impurity diffusion area (source or drain) provided in a semiconductor substrate, a gate insulating film provided in an area located on a channel which is formed in the semiconductor substrate and enclosed by the impurity diffusion area, and a gate electrode provided on the gate insulating film. In this regard, the length of the impurity diffusion area along a direction orthogonal to a direction in which the channel is formed is defined to be the width W of the transistor.

In this case, the width W of the NMOS transistor 181a is $W=W0 \times (1-N)$ (W0 is a positive number), and width W of the NMOS transistor 181e is $W=W0 \times N$. A similar relation exists between the above-described other transistors. In other words, the above-described "size of the transistor" is synonymous with the width W of the transistor.

The NMOS transistor 181a need not be a single transistor but may include a plurality of transistors. In other words, the relation between the total of the widths W of a plurality of transistors provided in the NMOS transistor 181a and the total of the widths W of a plurality of transistors provided in the NMOS transistor 181e may be $(1-N):N$. This also applies to the other transistors provided in the converter 181.

In the above description, the dimensional relation between the NMOS transistors 181a and 181e, the dimensional relation between the NMOS transistors 181g and 181c, the dimensional relation between the NMOS transistors 181b and 181f, and the dimensional relation between the NMOS transistors 181h and 181d are similar. However, the dimensional relation between the NMOS transistors 181a and 181e, the dimensional relation between the NMOS transistors 181g and 181c, the dimensional relation between the NMOS transistors 181b and 181f, and the dimensional relation between the NMOS transistors 181h and 181d may be different from one another.

It is desirable in view of effects described below that the dimensional relation between the NMOS transistors 181a and 181e, the dimensional relation between the NMOS transistors 181g and 181c, the dimensional relation between the NMOS transistors 181b and 181f, and the dimensional relation between the NMOS transistors 181h and 181d are similar.

<1-4-2-2> Layout Example of the Converter

Figure 8:
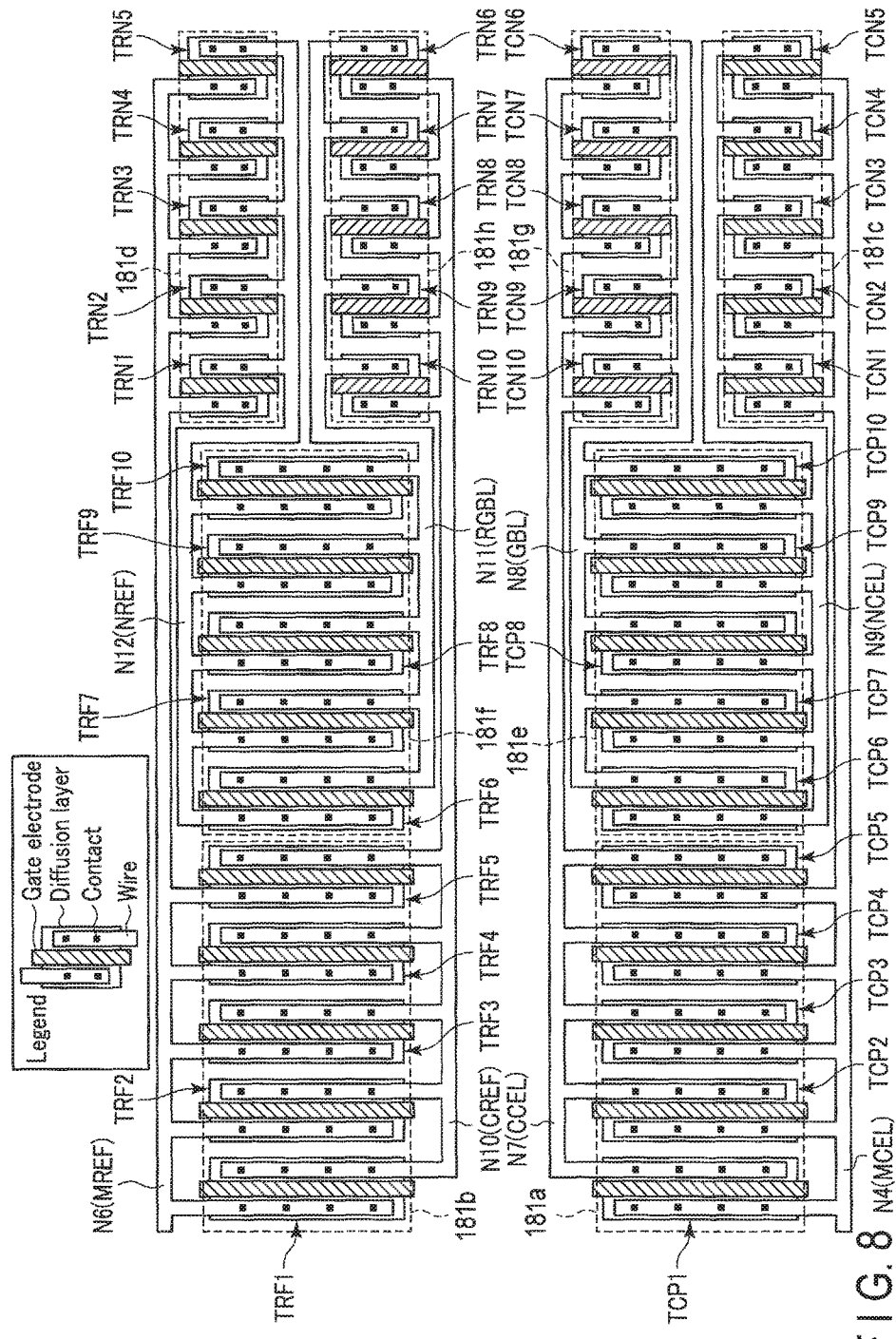
FIG. 8 is a layout of a converter in the semiconductor storage device according to the first embodiment.

Now, a layout in a case where the clamp transistors and the read enable transistors each include a plurality of transistors will be described. A specific layout example of the converter 181 will be described using FIG. 8. In FIG. 8, an interlayer insulating film and the like are omitted for simplification.

For example, the NMOS transistors 181a, 181b, 181c, 181d, 181e, 181f, 181g, and 181h according to the present embodiment each include a plurality of transistors.

As depicted in FIG. 8, the NMOS transistor 181a includes five transistors TCP1 to TCP5. The NMOS transistor 181e includes five transistors TCP6 to TCP10. The transistors TCP1 to TCP10 are transistors having similar sizes or properties.

The NMOS transistor 181c includes five transistors TCN1 to TCN5. The NMOS transistor 181g includes five transistors TCN6 to TCN10. The transistors TCN1 to TCN10 are transistors having similar sizes or properties.

As depicted in FIG. 8, the NMOS transistor 181b includes five transistors TRF1 to TRF5. The NMOS transistor 181f includes five transistors TRF6 to TRF10. The transistors TRF1 to TRF10 are transistors having similar sizes or properties.

The NMOS transistor 181d includes five transistors TRN1 to TRN5. The NMOS transistor 181h includes five transistors TRN6 to TRN10. The transistors TRN1 to TRN10 are transistors having similar sizes or properties.

The transistors TCP1 to TCP10, TCN1 to TCN10, TRF1 to TRF10, and TRN1 to TRN10 each include an impurity diffusion area (source or drain) provided in a semiconductor substrate, a gate insulating film provided in an area located on the semiconductor substrate and enclosed by the impurity diffusion area and in which a channel is formed, and a gate electrode provided on the gate insulating film. The transistors are connected to respective nodes via contacts provided on the impurity diffusion area. Furthermore, the nodes and gate electrodes are connected to respective wires via contacts not depicted in the drawings.

Figure 9:
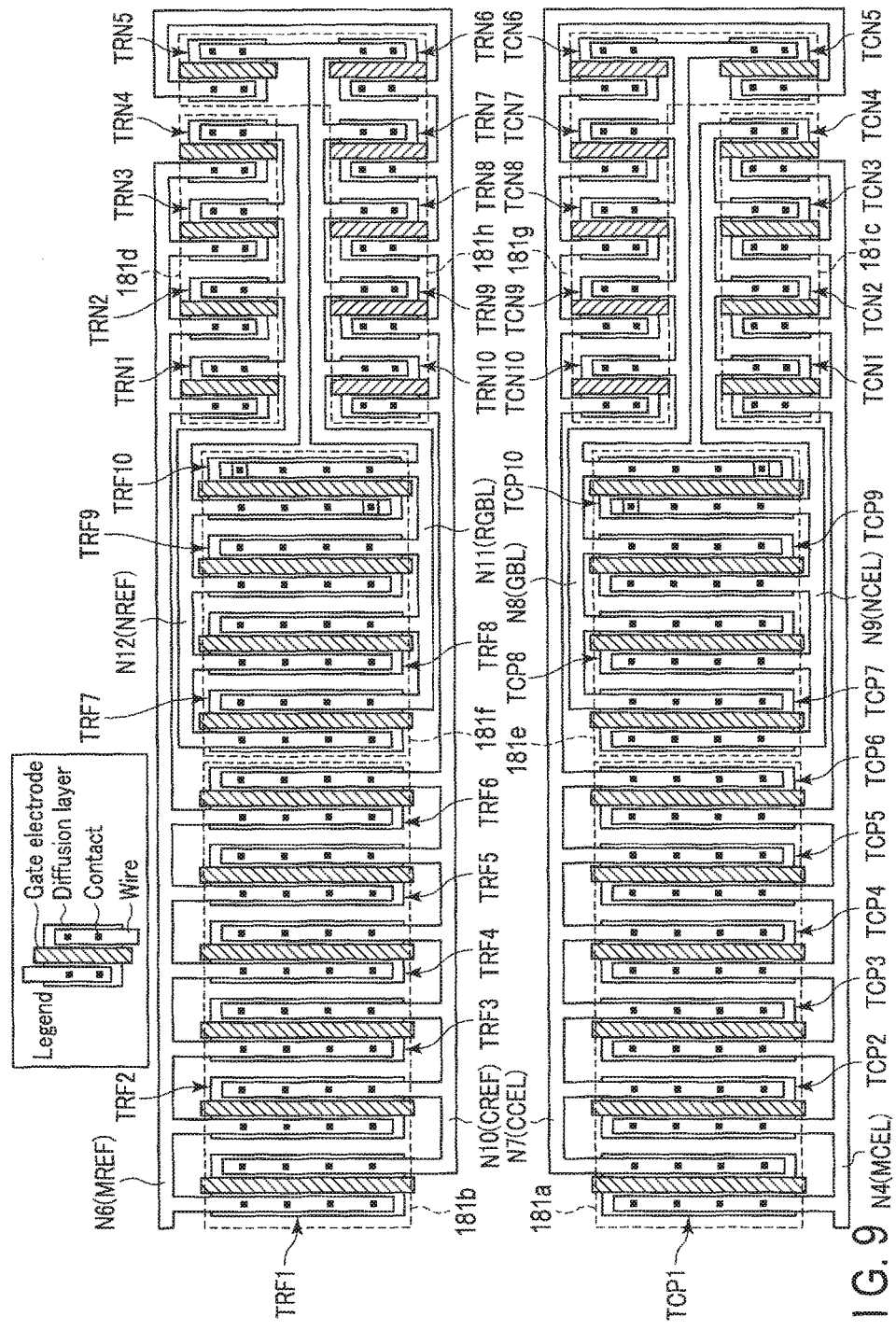
FIG. 9 is a layout of the converter in the semiconductor storage device according to the first embodiment.

For example, connection relations among the transistors TCP1 to TCP10, TCN1 to TCN10, TRF1 to TRF10, and TRN1 to TRN10 are as illustrated in FIG. 9. Specifically, as depicted in FIG. 9, the NMOS transistor 181a includes six transistors TCP1 to TCP6. The NMOS transistor 181e includes four transistors TCP7 to TCP10. The NMOS transistor 181c includes four transistors TCN1 to TCN4. The NMOS transistor 181g includes six transistors TONS to TCN10. The NMOS transistor 181b includes six transistors TRF1 to TRF6. The NMOS transistor 181f includes four transistors TRF7 to TRF10. The NMOS transistor 181d includes four transistors TRN1 to TRN4. The NMOS transistor 181h includes six transistors TRN5 to TRN10.

As described above, in the present embodiment, various changes may be made to the connection relations among the transistors TCP1 to TCP10, TCN1 to TCN10, TRF1 to TRF10, and TRN1 to TRN10. Furthermore, various changes to the connection relations may be made simply by changing the layout of one layer (wiring layer), and thus, changes can be made as needed. The reason why various changes are made to the connection relations among the transistors will be described below.

<1-5> Read Operation

Figure 10:
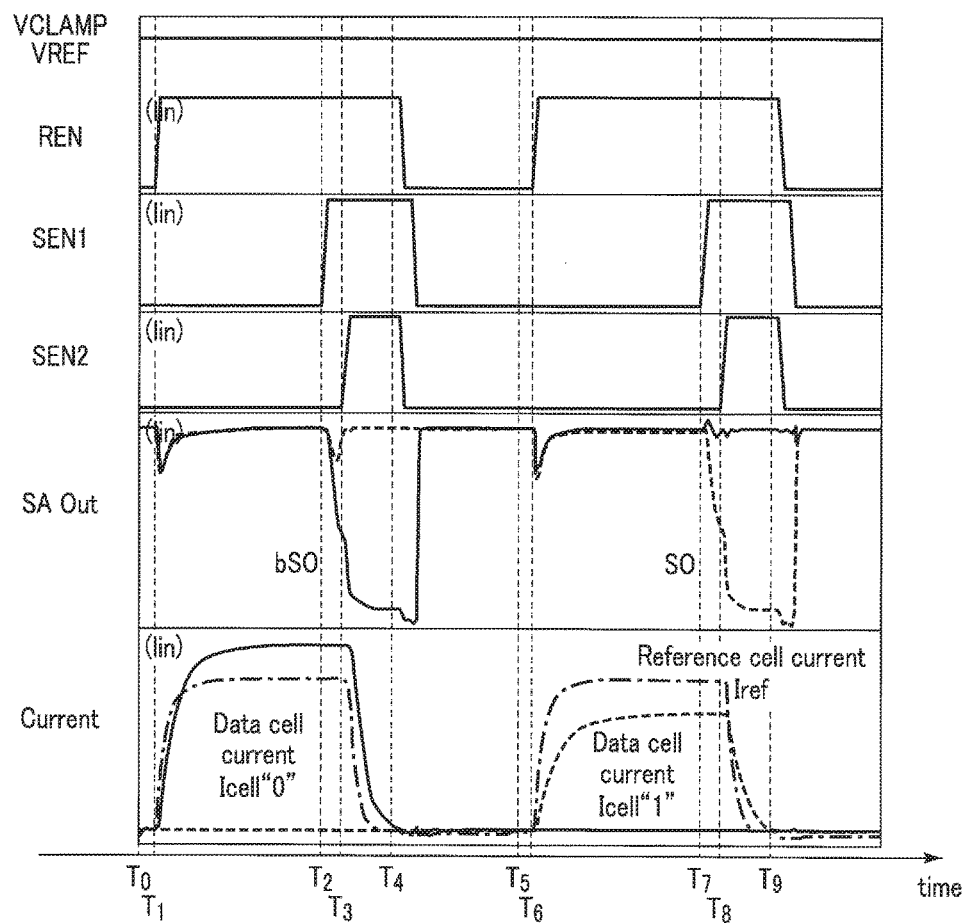
FIG. 10 is a waveform diagram illustrating a read operation in the semiconductor storage device according to the first embodiment.

A basic read operation in the semiconductor storage device according to the present embodiment will be described using FIG. 10. FIG. 10 illustrates a case where "0" data is read during a period between time T0 and time T5 and a case where "1" data is read during a period starting at time T6. In the read operation described below, the controller 12 controls the signals.

[Time T0]

At time T0, the controller 12 sets the levels of the signals "REN", "SEN", and "SEN2" to an "L (Low)" level, and sets the signals "VCLAMP" and "VREF" to an "H (High)" level. In this regard, the "L" level is a voltage that sets the NMOS transistor to an off state, while setting the PMOS transistor to an on state. Furthermore, the "H" level is a voltage that sets the PMOS transistor to the off state, while setting the NMOS transistor to the on state.

Thus, the PMOS transistors 180a and 180b and the NMOS transistors 180e, 180f, 181a, 181b, 181e, and 181f are set to the on state. Furthermore, the PMOS transistors 180c and 180d and the NMOS transistors 180g, 180h, 181c, 181d, 181g, and 181h are set to the off state.

[Time T1]

At time T1, the controller 12 raises the level of the signal "REN" from the "L" level to the "H" level. This sets the NMOS transistors 181c and 181g to the on state to allow a cell current (Icell) to flow from the sense amplifier 18a to the memory cell MC. Furthermore, the NMOS transistors 181d and 181h are set to the on state to allow a reference current (Iref) to flow from the sense amplifier 18a to the reference circuit 30.

[Time T2]

At time T2 when the difference between the cell current (Icell) and the reference current (Iref) expected to have been sufficient to be detected by the amplifier 180, the controller 12 raises the level of the signal "SEN1" from the "L" level to the "H" level.

This sets the PMOS transistors 180a and 180b to the off state. Thus, the cell current (Icell) causes charge to be drawn out from the node N1, and the reference current (Iref) causes charge to be drawn out from the node N2. At this time, the difference between a signal "bSO" and a signal "SO" is amplified in the amplifier 180.

When the data stored in the memory cell MC is the "0" data, resistance is reduced to increase the cell current (Icell) above the reference current (Iref). Thus, at time T2, more charge is drawn out from the node N1 than from the node N2. As a result, the PMOS transistor 180d is set to the on state, and the NMOS transistor 180f is set to the off state, causing a voltage to be applied to the node N2 via the node N3. Consequently, the node N2 is set to the "H" level, the PMOS transistor 180c is set to the off state, and the NMOS transistor 180e is set to the on state.

[Time T3]

At time T3, the controller 12 raises the level of the signal "SEN2" from the "L" level to the "H" level.

This sets the NMOS transistors 180g and 180h to the on state to set the node N4 and the node N6 to the ground potential. As described above, the NMOS transistor 180e is set to the on state, and the NMOS transistor 180f is set to the off state. Thus, the node N1 is connected to the ground potential, and charge is drawn out from the node N1. Consequently, the signals "bSO" and "SO" amplified based on data are latched by a page buffer not depicted in the drawings.

[Time T4 and Time T5]

During a period from time T4 and time T5, the controller 12 lowers the levels of the signals "REN", "SEN1", and "SEN2" from the "H" level to the "L" level. This starts an operation of charging the node N1 and the node N2.

[Time T6 to Time T9]

An operation of the controller 12 between time T6 and time T9 is similar to the above-described operation between time T1 and time T4 and will thus not be described.

<1-5-1> Pertaining to the Signal "VCLAMP" during the Read Operation

Now, noise to which the signal "VCLAMP" is subjected during the above-described read operation will be described. Noise to which the signal "VREF" is subjected during the read operation is similar do the noise to which the signal "VCLAMP" is subjected and will thus not be described.

As described above, the converter 181 according to the present embodiment has two current paths between the amplifier 180 and the global bit line GBL.

<1-5-2> Comparative Example 1

Noise to which the signal "VCLAMP" is subjected when the NMOS transistors 181c and 181e are not operated during the read operation (Comparative Example 1) will be described using FIG. 11.

Figures 11, 12:
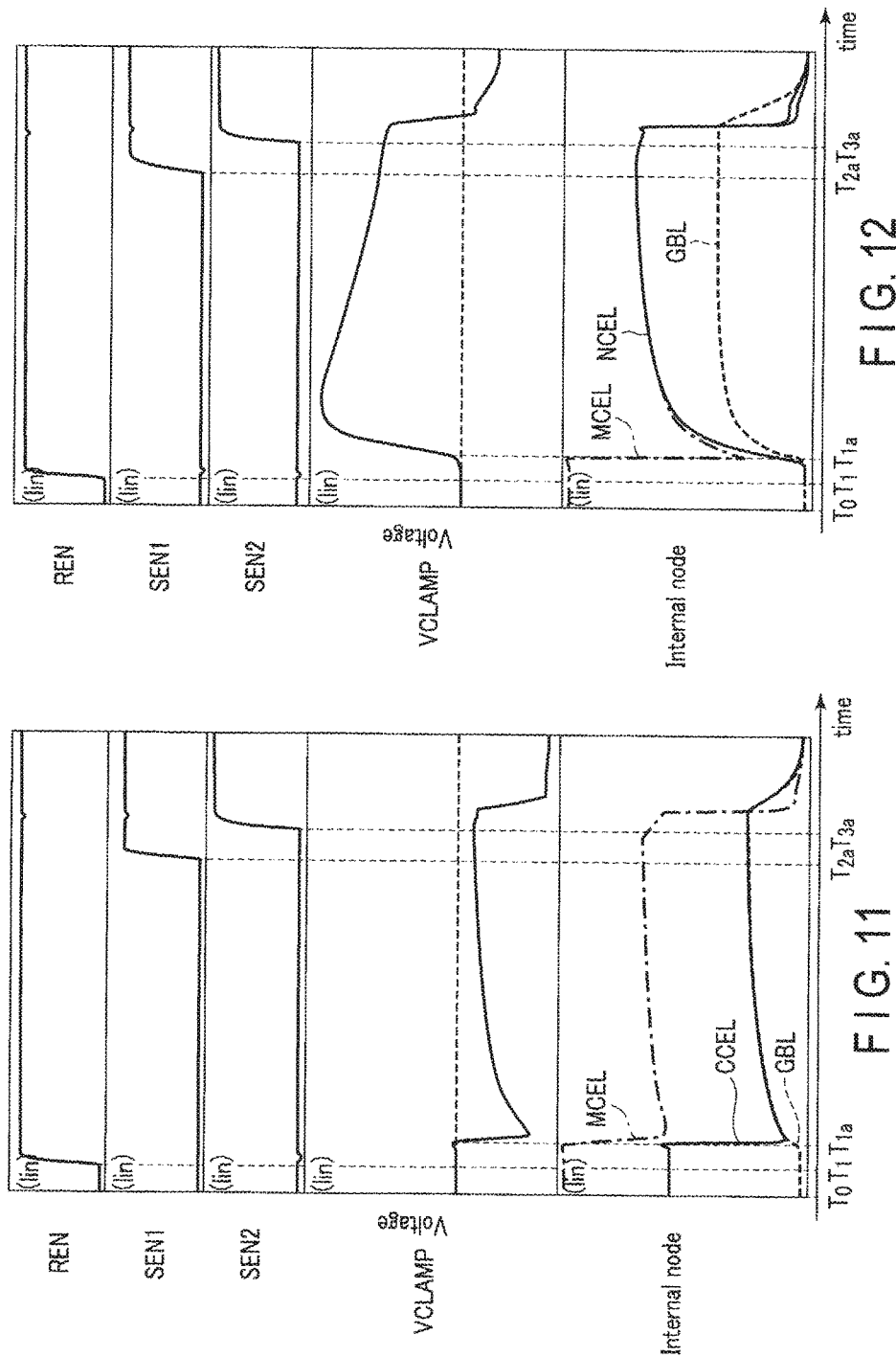
FIG. 11 is a waveform diagram illustrating a read operation in a semiconductor storage device according to Comparative Example 1 of the first embodiment.
FIG. 12 is a waveform diagram illustrating a read operation in a semiconductor storage device according to Comparative Example 2 of the first embodiment.

As depicted in FIG. 11, during the read operation, when the controller 12 raises the signal "REN" from the "L" level to the "H" level, the NMOS transistors 181a and 181g form a current path. The charge stored in the node N4 is drawn out to the global bit line GBL. Thus, the potentials of the node N4 and the node N7 lower.

This lowers the signal "VCLAMP" via capacitive coupling between the gate and source and between the gate and drain of the NMOS transistor 181a.

The NMOS transistor 181a is a transistor that supplies a current to the global bit line GBL. The signal "VCLAMP" determines a current to be supplied to the global bit line GBL, and it is thus not desirable that the voltage be varied by noise. The level of the signal "VCLAMP" during the read operation desirably corresponds to such a voltage as depicted by a dashed line as depicted in FIG. 11.

As described above, when the NMOS transistors 181c and 181e are not operated during the read operation, the signal "VCLAMP" is lowered by noise.

<1-5-3> Comparative Example 2

Now, noise to which the signal "VCLAMP" is subjected when the NMOS transistors 181a and 181g are not operated during the read operation (Comparative Example 2) will be described using FIG. 12.

As depicted in FIG. 12, during the read operation, when the controller 12 raises the signal "REN" from the "L" level to the "H" level, the NMOS transistors 181c and 181e form a current path. The charge stored in the node N4 is drawn out to the global bit line GBL. Thus, the potentials of the node N9 and the node N8 rise.

This raises the signal "VCLAMP" via capacitive coupling between the gate and source and between the gate and drain of the NMOS transistor 181e.

As described above, when the NMOS transistors 181a and 181g are not operated during the read operation, the signal "VCLAMP" is raised by noise.

<1-5-4> Relation Between the Size of the Transistor and Noise to which the Signal "VCLAMP" is Subjected Now, noise to which the signal "VCLAMP" is subjected when the NMOS transistors 181a, 181c, 181e, and 181g are operated during the read operation will be described using FIG. 13.

FIG. 13 depicts a voltage waveform obtained through simulation in which the NMOS transistors 181a and 181e have the same channel length and a channel width ratio of $(1-N):N (0 \leq N \leq 1)$ and in which the NMOS transistors 181c and 181g have the same channel length and a channel width ratio of $(1-N):N$, with the numerical value N varied.

As depicted in FIG. 13, the transistors in the converter 181 are arranged so as to form two current paths connecting the amplifier 180 and the global bit line GBL together, and the channel widths of the transistors are adjusted to enable a reduction in the noise to which the signal "VCLAMP" is subjected.

Although the channel lengths and channel widths of the transistors are not specified, the NMOS transistors 181a and 181e desirably have the same channel length and a channel width ratio of $(1-N):N (0 \leq N \leq 1)$ as illustrated in this example. Furthermore, the NMOS transistors 181c and 181g have the same channel length and a channel width ratio of $(1-N):N$. Additionally, the channel width ratio of the NMOS transistors 181a and 181e is the same as the channel width ratio of the NMOS transistors 181c and 181g.

As described for FIG. 8 and FIG. 9, the above-described simulation results can be obtained by changing a wiring pattern for each transistor in a design stage.

The above description also applies to the NMOS transistors 181b, 181d, 181f, and 181h.

This enables the noise to which the signal "VCLAMP" and the signal "VREF" are subjected to be reduced as needed.

<1-6> Advantageous Effects

According to the above-described embodiment, in the converter 181, the transistors are arranged so as to form two current paths connecting the amplifier 180 and the global bit line GBL together to adjust the channel widths of the transistors.

During the read operation, a rise in the signal "REN" varies the potentials of the drain and source of the clamp transistor. As a result, the signals "VCLAMP" and "VREF" vary via the capacitive coupling between the gate and source and between the gate and drain of the NMOS transistor 181e. A variation in the signals "VCLAMP" and "VREF" disadvantageously increases or reduces the cell current or the reference current (see Comparative Examples 1 and 2 described above).

In a semiconductor storage device that uses magnetoresistive elements as memory cells, a large cell current exponentially increases the probability of read disturb, and a small cell current increases time needed to develop a cell signal, thus extending a read time. Consequently, noise is suppressed to make an applied voltage equal to a predetermined value to enable suppression of the probability of read disturb and of an increase in read time.

Figure 14:
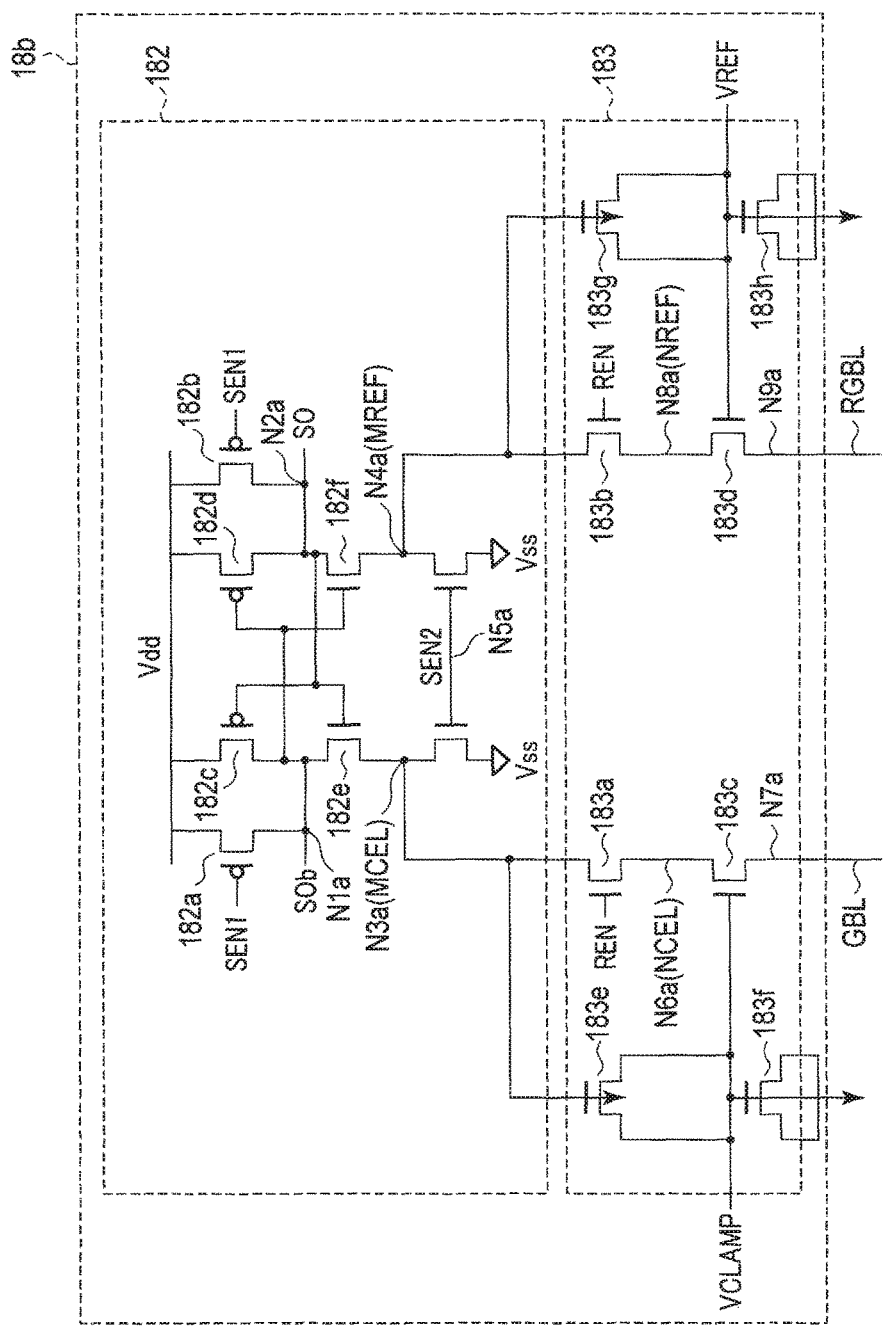
FIG. 14 is a circuit diagram depicting basic configuration of a sense amplifier in a semiconductor storage device according to a comparative example of the first embodiment.

As a method for solving the above-described problem, Comparative Example 3 as illustrated in FIG. 14 is assumed. A converter 183 in Comparative Example 3 is provided with capacitances 183e and 183f between a node N3a and a node to which the signal "VCLAMP" is input. This is intended for the above-described suppression of the noise to which the signals "VCLAMP" and "VREF" are subjected.

As described in Comparative Example 2, when no transistors corresponding to the NMOS transistors 181a and 181g are provided, the signal "VCLAMP" is raised as the signal "REN" rises.

The capacitances 183e and 183f act in a direction in which the signal "VCLAMP" is lowered as the signal "REN" rises. Thus, the capacitances 183e and 183f suppress the rise to some degree (see FIG. 15). Capacitances 183g and 183h depicted in FIG. 4 similarly suppress the rise in the signal "VREF" to some degree.

However, this noise cancelling method requires additional capacitances, which disadvantageously increases the area.

In the sense amplifier, the clamp transistors are most sensitive and most susceptible to noise, and noise received by the clamp transistors needs to be sufficiently suppressed. Thus, the clamp transistors are larger in area than the other transistors. For example, the size of the clamp transistors 183c and 183d is equivalent to approximately 90% of the entire area of the sense amplifier.

Figure 15:
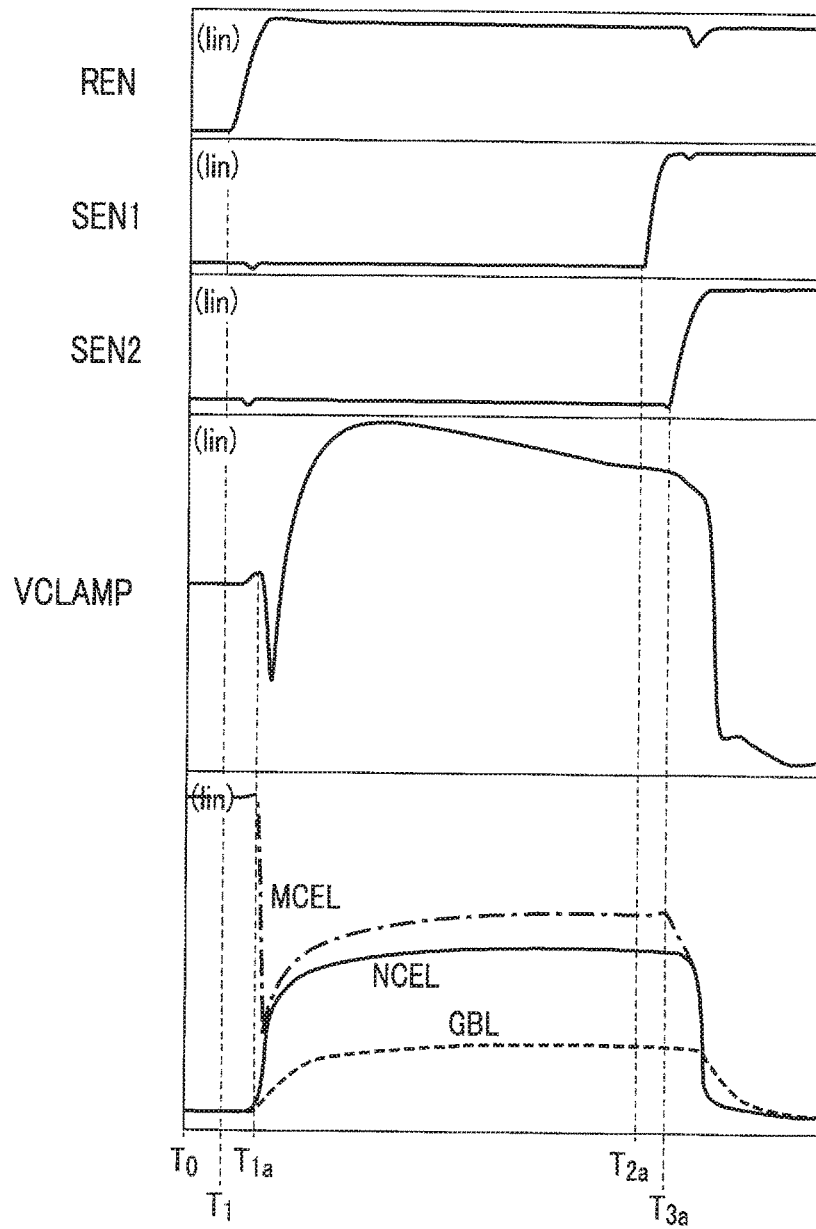
FIG. 15 is a waveform diagram illustrating a read operation in a semiconductor storage device according to Comparative Example 3 of the first embodiment.

In order to have a sufficient noise cancel capability, the capacitances 183e, 183f, 183g, and 183h need to have a larger size than the clamp transistors. In FIG. 15, the area of the capacitances 183e, 183f, 183g, and 183h is equivalent to the area of the clamp transistors 183c and 183d. However, even this fails to achieve sufficient noise cancellation. In order to have a sufficient noise cancelling capability, the capacitances 183e, 183f, 183g, and 183h need to have an area approximately 10 times as large as the area of the clamp transistors 183c and 183d. This has a great impact on a chip area.

However, the converter 181 according to the above-described present embodiment need not have additional capacitances in contrast to Comparative Example 3. In the present embodiment, if the total of the areas of the clamp transistors 181a and 181b is equal to the area of the clamp transistor 183c, the effects of the above-described present embodiment can be produced. Furthermore, although the transistors are arranged so as to form two current paths between the amplifier 180 and the global bit line GBL, an increase in the number of wires does not have a great impact on the chip area. Thus, compared to Comparative Example 3, the present embodiment can provide a semiconductor storage device that can sufficiently cancel the noise to which the signal "VCLAMP" and "VREF" are subjected, while suppressing an increase in circuit area.

Furthermore, it is difficult to provide more capacitances with large areas than needed in a semiconductor storage device the chip area of which needs to be reduced. Thus, the method in Comparative Example 3 reduces the range of noise adjustment. In the present embodiment, the converter 181 is constructed using many small transistors during layout, and thus the noise can be adjusted in detail and over a wide range.

(Second Embodiment)

A second embodiment will be described using FIG. 16. In the second embodiment, a case will be described where new transistors are provided in the above-described amplifier 180. The basic configuration and operation of a storage device according to the second embodiment are similar to the basic configuration and operation of the storage device according to the above-described first embodiment. Thus, matters described above in the first embodiment and matters easily inferable from the above-described first embodiment will not be described.

<2-1> Configuration of the Sense Amplifier

A sense amplifier according to the present embodiment will be described using FIG. 16.

Figure 16:
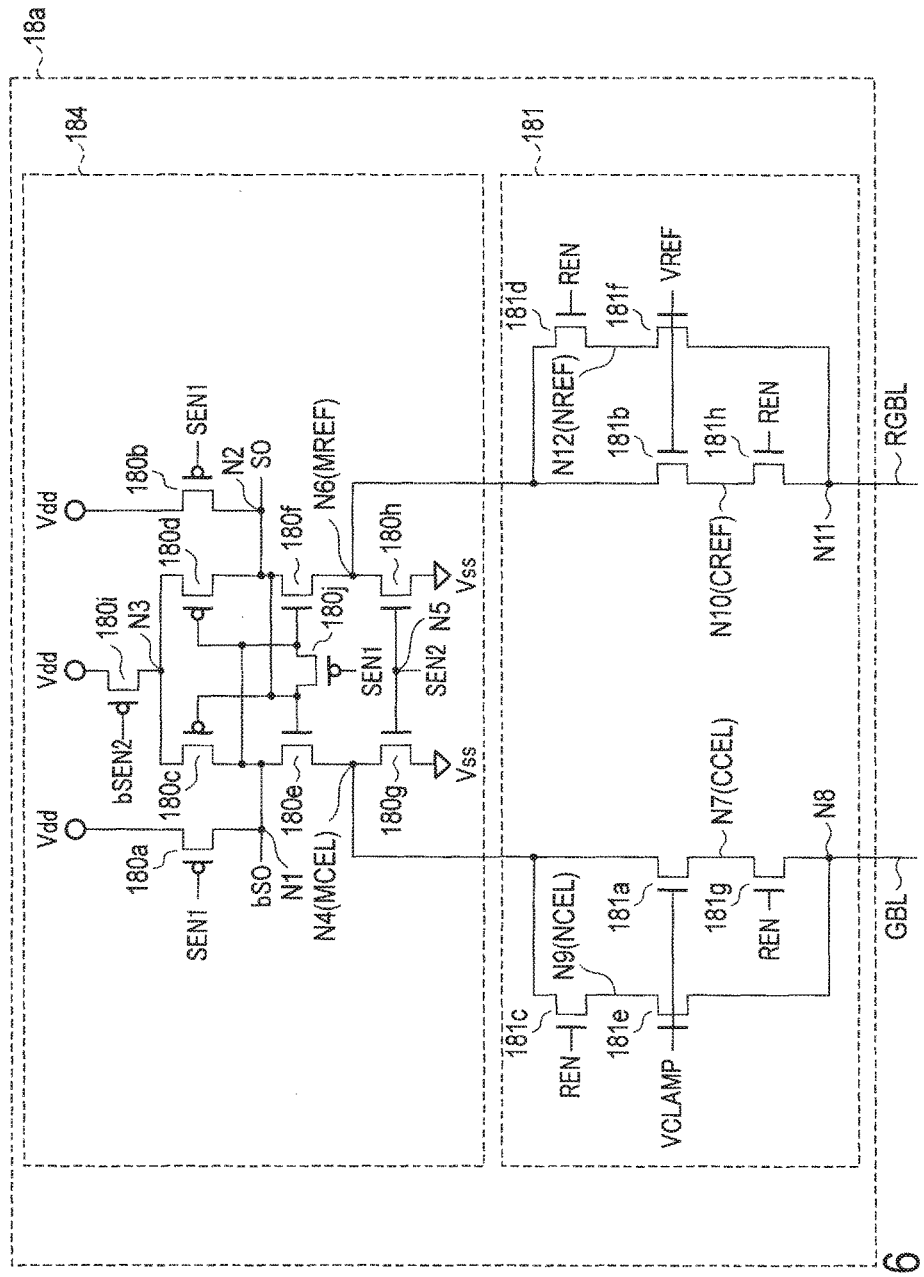
FIG. 16 is a circuit diagram depicting a basic configuration of a sense amplifier in a semiconductor storage device according to a second embodiment.

As depicted in FIG. 16, a sense amplifier 18a includes a converter 181 and an amplifier 184 that compares and amplifies two output signals output from the converter 181.

The amplifier 184 includes PMOS transistors 180a, 180b, 180c, 180d, 180i, and 180j and NMOS transistors 180e, 180f, 180g, and 180h.

A power supply voltage Vdd is applied to a source of the PMOS transistor 180i. A drain of the PMOS transistor 180i is connected to a node N3. A signal "bSEN2 (an inverted signal of SEN2)" is input to a gate of the PMOS transistor 180i. A source of the PMOS transistor 180j is connected to a node N1. A drain of the PMOS transistor. 180j is connected to a node N2. A signal "SEN1" is input to a gate of the PMOS transistor 180j.

<2-2> Advantageous Effects

According to the present embodiment, the amplifier 184 is provided with the PMOS transistor 180i. This allows disconnection of a power supply to a latch circuit comprising the PMOS transistors 180c and 180d and the NMOS transistors 180e and 180f until the "SEN2" is set to an "H" level. This allows prevention of a situation where, before signals "bSO" and "SO" are sufficiently amplified, a part of the latch circuit operates to latch incorrect data. Thus, the present embodiment is effective for suppressing read errors.

Furthermore, the provision of the PMOS transistor 180j allows the voltages of the signals "bSO" and "SO" to be set to be the same by short-circuiting the signals "bSO" and "SO" until immediately before a signal "SEN1" is set to the "H" level to start an amplifying operation. For example, when the output voltages differ from each other before the amplifying operation, a read error may occur. Thus, the present embodiment is effective for suppressing read errors.

The amplifier 184 provided with both the PMOS transistor 180i and the PMOS transistor 180j has been described. However, the present invention is not limited to this. Specifically, either one may be deleted.

(Third Embodiment)

A third embodiment will be described using FIG. 17. In the third embodiment, a case will be described where new transistors are provided in the above-described converter 181. The basic configuration and operation of a storage device according to the third embodiment are similar to the basic configuration and operation of the storage device according to the above-described first embodiment. Thus, matters described above in the first embodiment and matters easily inferable from the above-described first embodiment will not be described.

<3-1> Configuration of the Sense Amplifier

A sense amplifier according to the present embodiment will be described using FIG. 17.

As depicted in FIG. 17, a sense amplifier 18a includes a converter 185 and an amplifier 180.

The converter 185 includes NMOS transistors 181a, 181b, 181c, 181d, 181e, 181f, 181g, and 180h and PMOS transistors 181i, 181j, 181k, and 181l.

A source of the PMOS transistor 181i is connected to a node N13 to which a power supply voltage Vdd is applied. A drain of the PMOS transistor 181i is connected to a node N4. A signal "REN" is input to a gate of the PMOS transistor 181i. A source of the PMOS transistor 181j is connected to the node N13 to which the power supply voltage Vdd is applied. A drain of the PMOS transistor 181j is connected to a node N6. The signal "REN" is input to a gate of the PMOS transistor 181j. A source of the PMOS transistor 181k is connected to the node N13 to which the power supply voltage Vdd is applied. A drain of the PMOS transistor 181k is connected to a node N7. The signal "REN" is input to a gate of the PMOS transistor 181k. A source of the PMOS transistor 181l is connected to the node N13 to which the power supply voltage Vdd is applied. A drain of the PMOS transistor 181l is connected to a node N10. The signal "REN" is input to a gate of the PMOS transistor 181l.

<3-2> Operations

After data reading ends, the controller 12 sets the signal "REN" to an "L" level to set the PMOS transistors 181i, 181j, 181k, and 181l to the on state, thus charging the nodes of the converter 185.

For example, when the PMOS transistors 181i, 181j, 181k, and 181l are not provided, the node N4 is charged via the PMOS transistor 180a and the NMOS transistor 180e after reading ends. In this case, the NMOS transistor 180e gradually shifts to operation in a subthreshold region. Thus, much time is needed to charge the node N4. The node N7 is charged via the PMOS transistor 180a, and the NMOS transistors 180e and 181a. In this case, the NMOS transistors 180e and 181a gradually shift to operation in a sub-threshold region. Thus, much more time is needed to charge the node N7 than to charge the node N4. This also applies to the node N6 and the node N10.

If a read operation is started before the nodes N4, N6, N7, and N10 are fully charged, the waveforms of the nodes are different from the waveforms thereof in the last read operation. As a result, the effect exerted on the signal "VCLAMP" via capacitive coupling also changes. This results in impairment of the noise reduction effect of provision of two current paths as described in the first embodiment.

<3-3> Advantageous Effects

Thus, as described above, the converter 185 is provided with the PMOS transistors 181*i*, 181*j*, 181*k*, and 181*l* to enable a charging operation through a path different from the path with the NMOS transistors 180*e*, 180*f*, 181*a*, and 181*b*. In other words, the charging operation for the nodes N4, N6, N7, and N10 can be performed at high speed after the read operation ends. In other words, the time intervals between read operations can be reduced. As a result, the read operation can be achieved at higher speed.

In the above-described embodiment, the converter 185 is provided with the PMOS transistors 181*i*, 181*j*, 181*k*, and 181*l*. However, either a set of the PMOS transistors 181*i* and 181*j* or a set of the PMOS transistors 181*k* and 181*l* may be deleted.

Figure 18:
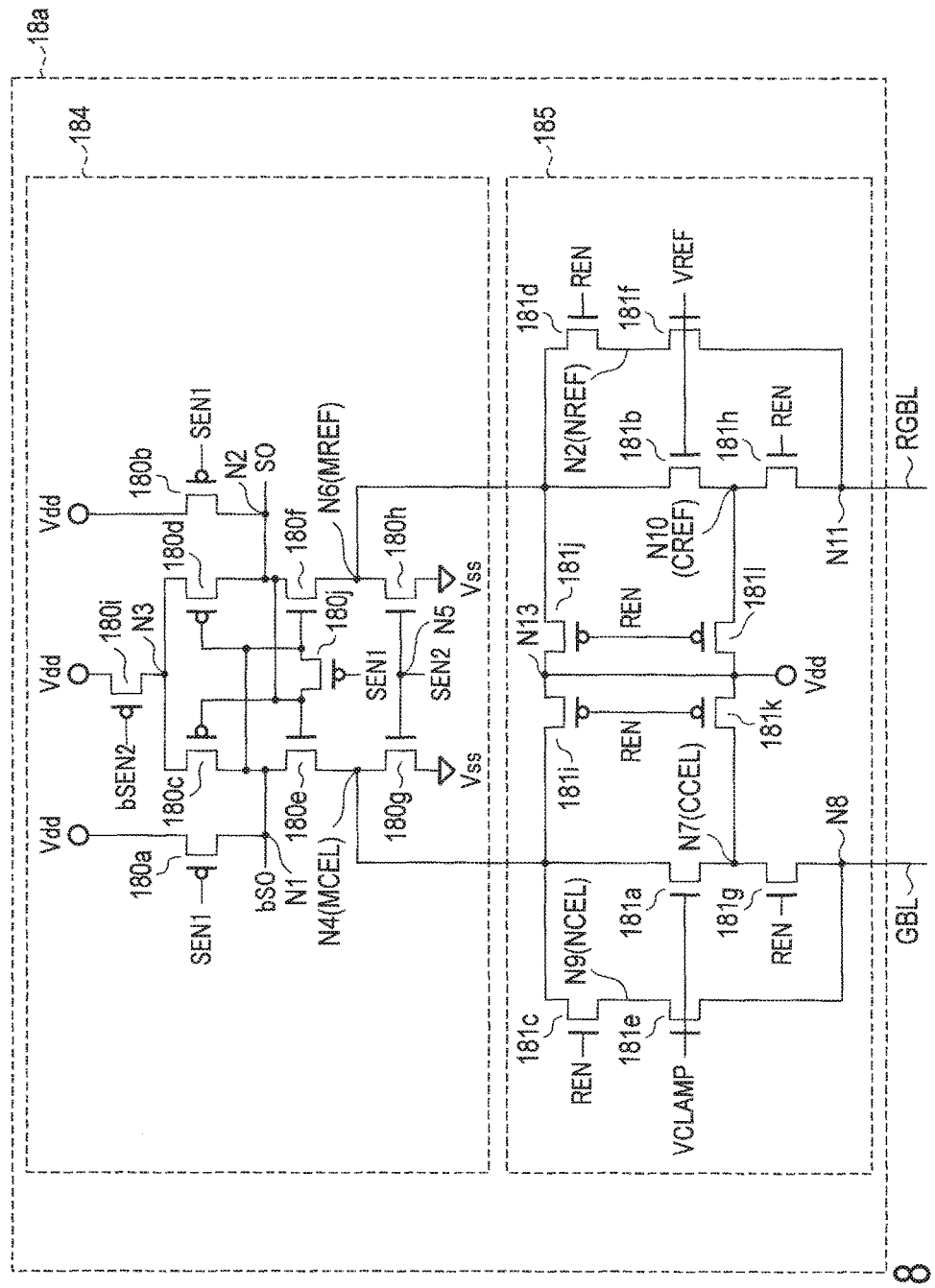
FIG. 18 is a circuit diagram depicting a basic configuration of a sense amplifier in a semiconductor storage device according to a modification of the third embodiment.

Furthermore, as depicted in FIG. 18, the amplifier 184 in the second embodiment and the converter 185 in the third embodiment may be combined together.

(Fourth Embodiment)

A fourth embodiment will be described using FIG. 19. In the fourth embodiment, a case where four clamp transistors are controlled using one signal will be described. The basic configuration and operation of a storage device according to the fourth embodiment are similar to the basic configuration and operation of the storage device according to the above-described first embodiment. Thus, matters described above in the first embodiment and matters easily inferable from the above-described first embodiment will not be described.

<4-1> Configuration of the Sense Amplifier

A sense amplifier according to the present embodiment will be described using FIG. 19.

As depicted in FIG. 19, a sense amplifier 18*a* includes a converter 186 and an amplifier 180.

The converter 186 includes NMOS transistors 181*a*, 181*c*, 181*d*, 181*e*, 181*g*, 180*h*, 181*m*, and 181*n*.

A drain of the NMOS transistor 181*m* (clamp transistors) is connected to a node N6. A source of the NMOS transistor 181*m* is connected to a node N10 (CREF). A signal "VCLAMP" is input to a gate of the transistor 181*m*. The signal "VCLAMP" is the same as a signal input to gates of the NMOS transistors 181*a* and 181*e*.

A drain of the NMOS transistor 181*n* (clamp transistor) is connected to a node N12 (NREF). A source of the NMOS transistor 181*n* is connected to a node N11. The signal "VCLAMP" is input to a gate of the NMOS transistor 181*n*.

As described above, the converter 186 according to the present embodiment uses the signal "VCLAMP" to control the clamp transistors 181*a* and 181*e* that control the cell current and the clamp transistors 181*m* and 181*n* that control the reference current. The signal input to the gates of the clamp transistors 181*m* and 181*n* is different from the signal input to the gates of the clamp transistors 181*b* and 181*f* described in the first embodiment. However, these transistors have similar structures.

<4-2> Temperature Property

Figure 20:
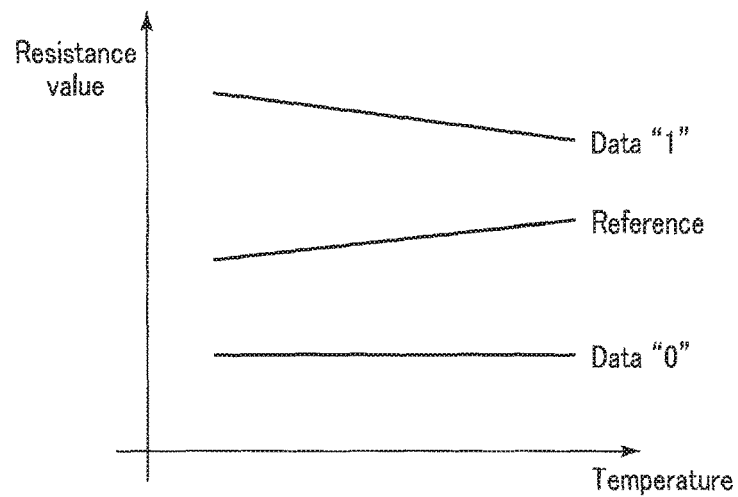
FIG. 20 is a graph illustrating temperature properties of the memory cell and a reference circuit.

A temperature property of a memory cell MC and a temperature property of a reference circuit 30 are not necessarily the same. For example, when the reference circuit 30 includes a resistance element 30*a* with a fixed resistance value as described above using FIG. 6, the temperature properties of the memory cell MC and the reference circuit 30 differ from each other depending on temperature as depicted in FIG. 20. When the memory cell and the reference circuit 30 have different temperature properties, the resistance of the reference circuit 30 does not have the optimum value (an intermediate value between a cell current for "0" data and a cell current for "1" data) over an entire operating temperature range.

<4-3> Reference Circuit

Figure 21:
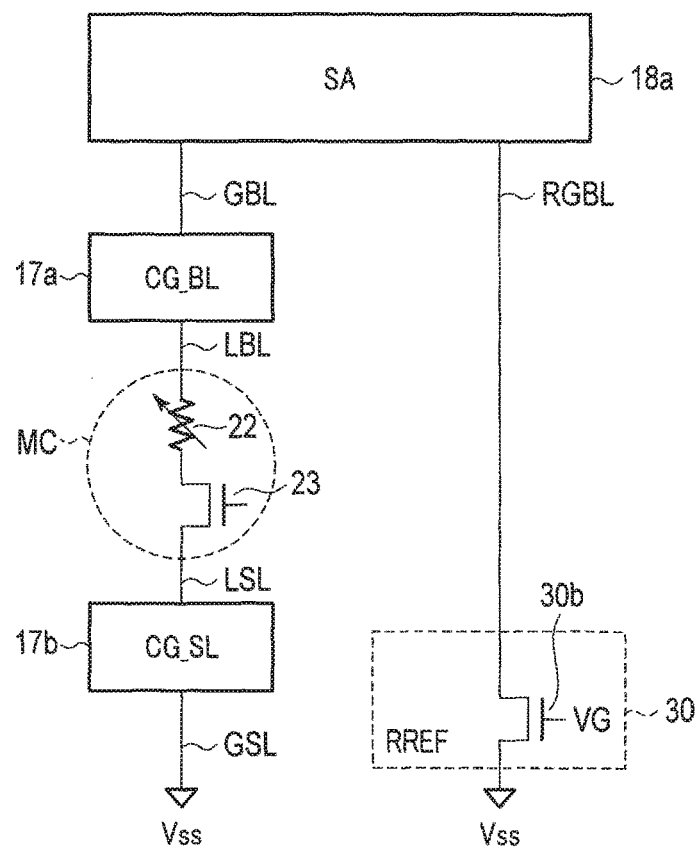
FIG. 21 is a diagram illustrating a relation between a sense amplifier and a peripheral circuit for the sense amplifier in the semiconductor storage device according to the fourth embodiment.

Thus, in the present embodiment, in order to enable the temperature of the reference circuit 30 to be adjusted, an NMOS transistor 30*b* configured as a variable resistance element is provided as depicted in FIG. 21. A reference global bit line RGBL is connected to a drain of the NMOS transistor 30*b*. A ground potential is connected to a source of the NMOS transistor 30*b*. A signal "VG" is input to a gate of the NMOS transistor 30*b*. The signal "VG" is generated by a signal generating circuit not depicted in the drawings. The signal generating circuit generates the signal "VG" such that the resistance value of the reference circuit 30 is optimum over the entire operating temperature range. Furthermore, the signal generating circuit desirably generates the Signal "VG" using a boosted voltage. This makes the gate of the NMOS transistor 30*b* unsusceptible to a variation in gate-source voltage.

The reference circuit 30 includes the NMOS transistor 30*b*, but the present embodiment is not limited to this. Any resistance element is applicable which enables the resistance value to be made variable in accordance with a variation in the temperature property of the memory cell MC.

As described above, when the reference circuit 30 includes a variable resistance element, the sense amplifier in the present embodiment can be efficiently utilized.

<4-4> Advantageous Effects

According to the above-described embodiment, the controller 12 uses the single signal "VCLAMP" to control the two clamp transistors 181*a* and 181*e* that control the cell current and the two clamp transistors 181*m* and 181*n* that control the reference current. The reference circuit 30 includes the variable resistance element that operates in accordance with the temperature property of the memory cell MC.

The use of the single signal for operation of the clamp transistors improves the resistance to noise remaining after noise cancellation and to which the signal "VCLAMP" is subjected, thus increasing a read margin. Furthermore, the area of the reference circuit 30 with the NMOS transistor 30*b* is smaller than the area of the reference circuit 30 with the resistance element.

The fourth embodiment is also applicable to the above-described second and third embodiments.

(Fifth Embodiment)

A fifth embodiment will be described using FIG. 22. In the fifth embodiment, a modification of the read operation will be described. The basic configuration and operation of a storage device according to the fifth embodiment are similar to the basic configuration and operation of the storage device according to the above-described first embodiment. Thus, matters described above in the first embodiment and matters easily inferable from the above-described first embodiment will not be described.

<5-1> Circuit Configuration

In FIG. 22, a bit line select circuit 17*a*, a source line select circuit 17*b*, a reference circuit 30, and a transistor 40 are depicted as a cell array unit CAU. A first end of the transistor 40 is connected to a global bit line GBL. A second end of the transistor 40 is connected to the reference circuit 30.

Setting the transistor 40 to the off state allows data to be read from and written to the cell array 11a. In the present embodiment, a cell array unit that uses a cell array 11a as a memory region is labeled "CCAU".

Setting the transistor 40 to the on state allows the reference circuit 30 to operate. In the present embodiment, a cell array unit that allows the reference circuit 30 to operate is labeled "RCAU".

A sense amplifier 18a is connected to the cell array unit CCAU via the global bit line GBL. The sense amplifier 18a is connected to the cell array unit RCAU via a reference global bit line RGBL.

The cell array unit CCAU and the cell array unit RCAU have similar structures. However, transistors driven by the cell array unit CCAU are different from transistors driven by the cell array unit RCAU. The cell array unit CCAU may become the cell array unit RCAU and the cell array unit RCAU may become the cell array unit CCAU given that the driven transistors perform operations opposite to the operations illustrated below.

<5-2> Operations

When performing a read operation on a memory cell MC in the cell array unit CCAU, the controller 12 sets the transistor 40 in the cell array unit CCAU to the off state. Furthermore, the controller 12 sets, to the on state, one of a plurality of transistors that corresponds to the memory cell MC on which reading is performed, transistors 24, transistors 23, and transistors 26 in the cell array unit CCAU The sense amplifier 18a is connected to the memory cells MC via the global bit line GBL, the transistor 24, and a local bit line LBL in the cell array unit CCAU. Furthermore, the sense amplifier 18a is connected to a around potential via the memory cell ML, the transistor 23, a local source line LSL, the transistor 26, and a global source line GSL in the cell array unit CCAU.

When performing a read operation on a memory cell MC in the cell array unit CCAU, the controller 12 sets the transistor 40 in the cell array unit RCAU to the on state. Furthermore, the controller 12 sets any one of the plurality of transistors 24 in the cell array unit RCAU to the on state. Additionally, the controller 12 sets all the transistors 23 in the cell array unit RCAU to the off state. In this case, the transistors 26 in the cell array unit RCAU may be in the on state or in the off state. The sense amplifier 18a is connected to the reference circuit 30 via the reference global bit line and the transistor 40 in the cell array unit RCAU. The sense amplifier 18a is connected to the ground potential via the reference circuit 30 in the cell array unit RCAU in the cell array unit RCAU. Furthermore, the sense amplifier 18a is connected to at least one reference local bit line LBL via the reference global bit line and the transistor 24 in the cell array unit RCAU.

<5-3> Advantageous Effects

According to the above-described embodiment, in the cell array unit RCAU that operates the reference circuit 30, the controller 12 sets at least one transistor 24 to the on state and sets all the transistors 26 to the off state. Consequently, in the cell array unit RCAU, a parasitic capacitance on the reference local bit line RLBL is added to the reference global bit line RGBL. As a result, a parasitic capacitance added to the global bit line GBL in the cell array unit CCAU is substantially equal to the parasitic capacitance added to the reference global bit line RGBL in the cell array unit RCAU, enabling a reduction in read time.

The fifth embodiment is also applicable to the above-described second to fourth embodiments.

(Modifications and the Like)

In the above-described embodiments, the MRAM using magnetoresistive elements is taken as an example of the semiconductor storage device. However, the embodiments are not limited to this but are applicable to various types of semiconductor storage devices regardless of whether the semiconductor storage device is a volatile memory or a nonvolatile memory. Furthermore, the embodiments are applicable to resistance variable memories belonging to the same type as MRAMs, for example, FeRAM (Ferroelectric random access memory), PCRAM (phase change random access memory), and ReRAM (resistive random access memory).

Additionally, in certain parts of the above-described embodiments, the transistors are limited to NMOS transistors or PMOS transistors. However, the embodiments are not limited to these.

In addition, in the above-described embodiments, a bit line pair is referred to as the bit line BL and the source line SL for convenience. However, the embodiments are not limited to such. The bit line pair may be referred to as, for example, a first bit line and a second bit line.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a memory cell;
    a bit line connected to the memory cell; and
    a sense circuit connected to the bit line,
    wherein the sense circuit comprises:
    a first transistor with a first end connected to the bit line and a gate to which a first signal is input;
    a second transistor with a first end connected to a second end of the first transistor and a gate to which a second signal is input;
    a third transistor with a first end connected to the bit line and a gate to which the second signal is input;
    a fourth transistor with a first end connected to a second end of the third transistor and a gate to which the first signal is input; and
    an amplifier connected to a second end of the second transistor and to a second end of the fourth transistor.

2. The semiconductor storage device of claim 1, wherein:
    a dimensional ratio between the first transistor and the fourth transistor is identical to a dimensional ratio between the second transistor and the third transistor.

3. The semiconductor storage device of claim 1, further comprising:
    a reference circuit; and
    a reference bit line connected to the reference circuit,
    wherein the sense circuit comprises:
    a fifth transistor with a first end connected to the reference bit line and a gate to which the first signal is input;
    a sixth transistor with a first end connected to a second end of the fifth transistor, a second end connected to the amplifier, and a gate to which a third signal is input;
    a seventh transistor with a first end connected to the reference bit line and a gate to which the third signal is input; and an eighth transistor with a first end connected to a second end of the seventh transistor, a second end connected to the amplifier, and a gate to which the first signal is input.

4. The semiconductor storage device of claim 3, wherein:
a dimensional ratio between the first transistor and the fourth transistor is identical to a dimensional ratio between the second transistor and the third transistor, and
a dimensional ratio between the fifth transistor and the eighth transistor is identical to a dimensional ratio between the sixth transistor and the seventh transistor.

5. The semiconductor storage device of claim 3, wherein the second signal is a signal identical to the third signal.

6. The semiconductor storage device of claim 5, wherein the reference circuit comprises a transistor.

7. The semiconductor storage device of claim 3, wherein the amplifier comprises:
a ninth transistor of a first conductivity type with a first end connected to the second end of the second transistor and the second end of the fourth transistor, a second end connected to a first node, and a gate connected to a second node;
a tenth transistor of a second conductivity type different from the first conductivity type, the tenth transistor comprising a first end connected to the first node, a second end connected to a third node to which a power supply voltage is applied, and a gate connected to the second node;
an eleventh transistor of the first conductivity type with a first end connected to the second end of the sixth transistor and the second end of the eighth transistor, a second end connected to the second node, and a gate connected to the first node; and
a twelfth transistor of the second conductivity type with a first end connected to the second node, a second end connected to the third node, and a gate connected to the first node.

8. The semiconductor storage device of claim 7, wherein the amplifier further comprises:
a thirteenth transistor with a first end to which the power supply voltage is applied, a second end connected to the third node, and a gate to which a fourth signal is input; and
a fourteenth transistor with a first end connected to the first node, a second end connected to the second node, and a gate to which a fifth signal is input.

9. The semiconductor storage device of claim 3, further comprising:
a fifteenth transistor with a first end connected to the second end of the first transistor, a second end connected to a fourth node, and a gate to which the first signal is input; and
a sixteenth transistor with a first end connected to the second end of the fifth transistor, a second end connected to the fourth node, and a gate to which the first signal is input;
a seventeenth transistor with a first end connected to the second end of the second transistor, a second end connected to the fourth node, and a gate to which the first signal is input; and
an eighteenth transistor with a first end connected to the second end of the sixth transistor, a second end connected to the fourth node, and a gate to which the first signal is input,
wherein the first to eighth transistors are transistors of a first conductivity type, and
wherein the fifteenth to eighteenth transistors are transistors of a second conductivity type different from the first conductivity type.

10. A semiconductor storage device comprising:
a memory cell;
a bit line connected to the memory cell; and
a sense circuit connected to the bit line,
wherein the sense circuit comprises:
an amplifier;
a first path which connects the bit line and the amplifier together; and
a second path which connects the bit line and the amplifier together,
wherein the first path comprises:
a first transistor with a first end connected to the bit line and a gate to which a first signal is input; and
a second transistor with a first end connected to a second end of the first transistor, a second end connected to the amplifier, and a gate to which a second signal is input, and
wherein the second path comprises:
a third transistor with a first end connected to the bit line and a gate to which the second signal is input; and
a fourth transistor with a first end connected to a second end of the third transistor, a second end connected to the amplifier, and a gate to which the first signal is input.

11. The semiconductor storage device of claim 10, wherein:
a dimensional ratio between the first transistor and the fourth transistor is identical to a dimensional ratio between the second transistor and the third transistor.

12. The semiconductor storage device of claim 10, further comprising:
a reference circuit; and
a reference bit line connected to the reference circuit,
wherein the sense circuit comprises:
a third path which connects the reference bit line and the amplifier together; and
a fourth path which connects the reference bit line and the amplifier together.

13. The semiconductor storage device of claim 12, wherein the third path comprises:
a fifth transistor with a first end connected to the reference bit line and a gate to which the first signal is input;
a sixth transistor with a first end connected to a second end of the fifth transistor, a second end connected to the amplifier, and a gate to which a third signal is input, and
wherein the fourth path comprises:
a seventh transistor with a first end connected to the reference bit line and a gate to which the third signal is input; and
an eighth transistor with a first end connected to a second end of the seventh transistor, a second end connected to the amplifier, and a gate to which the first signal is input.

14. The semiconductor storage device of claim 13, wherein:
a dimensional ratio between the first transistor and the fourth transistor is identical to a dimensional ratio between the second transistor and the third transistor, and
a dimensional ratio between the fifth transistor and the eighth transistor is identical to a dimensional ratio between the sixth transistor and the seventh transistor.

15. The semiconductor storage device of claim 13, wherein:

the second signal is a signal identical to the third signal, and the reference circuit comprises a transistor.

16. The semiconductor storage device of claim 13, wherein the amplifier comprises:
- a ninth transistor of a first conductivity type with a first end connected to the second end of the second transistor and the second end of the fourth transistor, a second end connected to a first node, and a gate connected to a second node;
- a tenth transistor of a second conductivity type different from the first conductivity type, the tenth transistor comprising a first end connected to the first node, a second end connected to a third node to which a power supply voltage is applied, and a gate connected to the second node;
- an eleventh transistor of the first conductivity type with a first end connected to the second end of the sixth transistor and the second end of the eighth transistor, a second end connected to the second node, and a gate connected to the first node; and
- a twelfth transistor of the second conductivity type with a first end connected to the second node, a second end connected to the third node, and a gate connected to the first node.

17. The semiconductor storage device of claim 16, wherein the amplifier further comprises:
- a thirteenth transistor with a first end to which the power supply voltage is applied, a second end connected to the third node, and a gate to which a fourth signal is input; and
- a fourteenth transistor with a first end connected to the first node, a second end connected to the second node, and a gate to which a fifth signal is input.

18. The semiconductor storage device of claim 13, further comprising:
- a fifteenth transistor with a first end connected to the second end of the first transistor, a second end connected to the fourth node, and a gate to which the first signal is input; and
- a sixteenth transistor with a first end connected to the second end of the fifth transistor, a second end connected to a fourth node, and a gate to which the first signal is input;
- a seventeenth transistor with a first end connected to the second end of the second transistor, a second end connected to the fourth node, and a gate to which the first signal is input; and
- an eighteenth transistor with a first end connected to the second end of the sixth transistor, a second end connected to the fourth node, and a gate to which the first signal is input, wherein the first to eighth transistors are transistors of a first conductivity type, and wherein the fifteenth to eighteenth transistors are transistors of a second conductivity type different from the first conductivity type.

19. A semiconductor storage device comprising:
- a first memory cell;
- a first bit line connected to the first memory cell;
- a first transistor connected to the first bit line at a first end of the first transistor;
- a second bit line connected to a second end of the first transistor;
- a first reference circuit connected to the second bit line;
- a second memory cell;
- a third bit line connected to the second memory cell;
- a second transistor connected to the third bit line at first end of the second transistor;
- a fourth bit line connected to a second end of the second transistor;
- a second reference circuit connected to the fourth bit line; and
- a sense circuit connected to the second bit line and the fourth bit line, wherein the sense circuit comprises:
- a third transistor with a first end connected to the bit line and a gate to which a first signal is input;
- a fourth transistor with a first end connected to second end of the third transistor and a gate to which a second signal is input;
- a fifth transistor with a first end connected to the first bit line and a gate to which the second signal is input;
- a sixth transistor with a first end connected to a second end of the fifth transistor and a gate to which the first signal is input;
- an amplifier connected to a second end of the fourth transistor and a second end of the sixth transistor;
- a seventh transistor with a first end connected to the fourth bit line and a gate to which the first signal is input;
- an eighth transistor with a first end connected to a second end of the seventh transistor, a second end connected to the amplifier, and a gate to which a third signal is input;
- a ninth transistor with a first end connected to the fourth bit line and a gate to which the third signal is input; and
- a tenth transistor with a first end connected to a second end of the ninth transistor, a second end connected to the amplifier, and a gate to which the first signal is input, and wherein, when data in the first memory cell is read using the sense circuit, the first memory cell, the first transistor, the second transistor, and the second reference circuit are set to an on state, and the second memory cell and the first reference circuit are set to an off state.

* * * * *